(12) United States Patent
Morimoto et al.

(10) Patent No.: US 10,164,197 B2
(45) Date of Patent: Dec. 25, 2018

(54) ORGANIC ELECTROLUMINESCENT DEVICE

(71) Applicant: SAMSUNG DISPLAY CO., LTD., Yongin-si, Gyeonggi-do (KR)

(72) Inventors: Kazunori Morimoto, Yokohama (JP); Naoya Sakamoto, Yokohama (JP); Ichinori Takada, Yokohama (JP)

(73) Assignee: Samsung Display Co., Ltd., Yongin-si (KR)

( * ) Notice: Subject to any disclaimer, the term of this patent is extended or adjusted under 35 U.S.C. 154(b) by 126 days.

(21) Appl. No.: 15/077,269

(22) Filed: Mar. 22, 2016

(65) Prior Publication Data

US 2016/0380197 A1 Dec. 29, 2016

(30) Foreign Application Priority Data

Jun. 23, 2015 (JP) .................. 2015-125473
Jun. 23, 2015 (JP) .................. 2015-125474

(51) Int. Cl.
*B32B 19/00* (2006.01)
*H01L 51/00* (2006.01)
*H01L 51/50* (2006.01)

(52) U.S. Cl.
CPC ........ *H01L 51/006* (2013.01); *H01L 51/0052* (2013.01); *H01L 51/0054* (2013.01);
(Continued)

(58) Field of Classification Search
CPC ............ C09K 11/06; C09K 2211/1011; C07D 209/86; C07D 307/91; C07D 405/12;
(Continued)

(56) References Cited

U.S. PATENT DOCUMENTS

| 2006/0088728 | A1 | 4/2006 | Kwong et al. | |
| 2007/0092753 | A1* | 4/2007 | Begley | H01L 51/0052 428/690 |
| 2012/0302762 | A1* | 11/2012 | Osaka | C07D 209/88 548/442 |

FOREIGN PATENT DOCUMENTS

| CN | 102757300 A | 10/2012 |
| JP | 2002-241352 A | 8/2002 |

(Continued)

OTHER PUBLICATIONS

Japanese Patent Abstract for WO 2009-037155 A1, which corresponds to JP Publication No. JP 2010-539718 A, published Dec. 16, 2010, 1 page.

(Continued)

*Primary Examiner* — Shane Fang
(74) *Attorney, Agent, or Firm* — Lewis Roca Rothgerber Christie LLP

(57) ABSTRACT

An organic electroluminescent device having improved emission efficiency includes an anode, an emission layer, an anode-side hole transport layer between the anode and the emission layer and mainly including an electron accepting material, a middle hole transport material layer between the anode-side hole transport layer and the emission layer and including a middle hole transport material, and an emission layer-side hole transport layer between the middle hole transport material layer and the emission layer, adjacent to the emission layer and including an emission layer-side hole transport material represented by the following Formula 1.

Formula 1

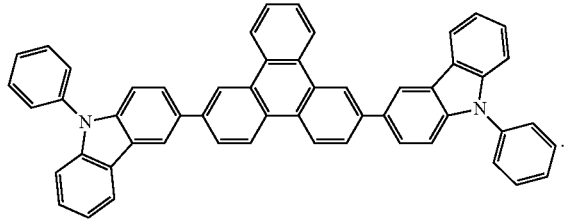

7 Claims, 1 Drawing Sheet

(52) U.S. Cl.
CPC ...... *H01L 51/0058* (2013.01); *H01L 51/0059* (2013.01); *H01L 51/0061* (2013.01); *H01L 51/0072* (2013.01); *H01L 51/0073* (2013.01); *H01L 51/0074* (2013.01); *H01L 51/5004* (2013.01); *H01L 51/5012* (2013.01); *H01L 51/5056* (2013.01); *H01L 51/5064* (2013.01); *H01L 2251/552* (2013.01)

(58) Field of Classification Search
CPC ... H01L 51/06; H01L 51/006; H01L 51/0061; H01L 51/0072; H01L 51/5012; H01L 51/5056; H01L 51/5088; H05B 33/14
See application file for complete search history.

(56) References Cited

FOREIGN PATENT DOCUMENTS

| | | |
|---|---|---|
| JP | 2006-143845 A | 6/2006 |
| JP | 2008-291263 A | 12/2008 |
| JP | 2009-221442 A | 10/2009 |
| JP | 2010-539718 A | 12/2010 |
| JP | 2011-187959 A | 9/2011 |
| JP | 2014-504257 A | 2/2014 |
| KR | 10-2013-0007159 A | 1/2013 |
| WO | WO 2007/105906 A1 | 9/2007 |

OTHER PUBLICATIONS

Japanese Patent Abstract for DE 102010048608 A1, which corresponds to JP Publication No. JP 2014-504257 A, published Feb. 20, 2014, 1 page.

\* cited by examiner

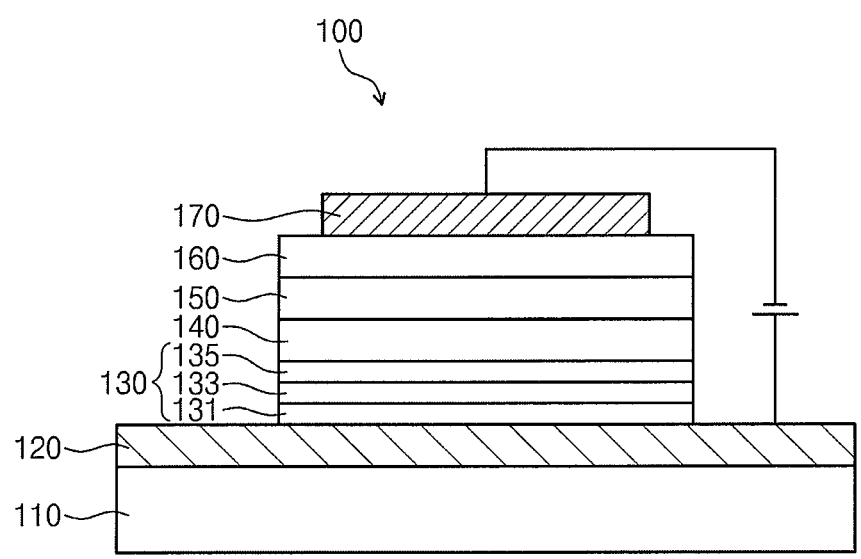

ORGANIC ELECTROLUMINESCENT DEVICE

CROSS-REFERENCE TO RELATED APPLICATIONS

This U.S. non-provisional patent application claims priority under 35 U.S.C. § 119 to and the benefit of Japanese Patent Application No. 2015-125473, filed on Jun. 23, 2015, and Japanese Patent Application No. 2015-125474, filed on Jun. 23, 2015, the entire contents of both of which are hereby incorporated by reference.

BACKGROUND

One or more aspects of embodiments of the present disclosure herein relates to an organic electroluminescent device.

Recently, developments of display devices and lighting devices using an organic electroluminescent (EL) device (which is a self-luminescent device) have been actively conducted. However, organic EL devices having improved performance are still needed for the application in the display device and the lighting device.

An organic EL device has, for example, a laminated structure of an anode, a hole injection layer, a hole transport layer, an emission layer, an electron transport layer, an electron injection layer, and a cathode. In such organic EL device, holes and electrons respectively injected from an anode and a cathode recombine in an emission layer to generate excitons, and the emission of light may be attained via the transition of the formed excitons to a ground state.

Techniques of improving a hole transport layer of an organic EL device have been described in the related art. For example, a hole transport material improving the emission property of an organic EL device has been disclosed. A technique of improving the emission property of an organic EL device by adding an electron accepting material to a hole transport layer, etc. has also been disclosed. In addition, technique of improving the emission property of an organic EL device by forming a hole transport layer having a laminated structure of multiple layers have been disclosed.

SUMMARY

The previously disclosed techniques of improving the emission efficiency of an organic EL device nevertheless may not achieve a satisfactory result, and thus further improvements in this field are desired.

One or more aspects of embodiments of the present disclosure are directed toward a novel and improved organic EL device having increased emission efficiency.

An embodiment of the inventive concept provides an organic EL device including an anode; an emission layer; an anode-side hole transport layer between the anode and the emission layer and including mainly an electron accepting material; a middle hole transport material layer between the anode-side hole transport layer and the emission layer and including a middle hole transport material; and an emission layer-side hole transport layer between the middle hole transport material layer and the emission layer, the emission layer-side hole transport layer being adjacent to the emission layer and including an emission layer-side hole transport material represented by the following Formula 1:

Formula 1

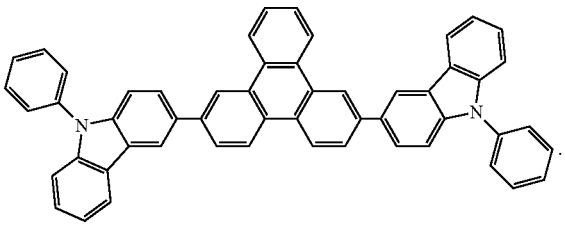

According to the embodiment, the emission efficiency of the organic EL device may be improved further.

In an embodiment, the middle hole transport material may be a compound represented by the following Formula 2:

Formula 2

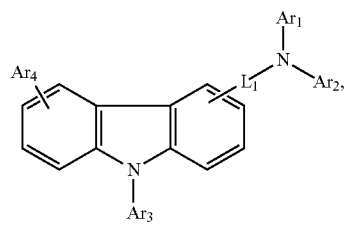

where, $Ar_1$-$Ar_3$ may be each independently a substituted or unsubstituted aryl group having 6 to 50 carbon atoms for forming a ring, or a substituted or unsubstituted heteroaryl group having 5 to 50 carbon atoms for forming a ring; $Ar_4$ may be selected from hydrogen, deuterium, a halogen atom, a substituted or unsubstituted aryl group having 6 to 50 carbon atoms for forming a ring, a substituted or unsubstituted heteroaryl group having 5 to 50 carbon atoms for forming a ring, and a substituted or unsubstituted alkyl group having 1 to 50 carbon atom; and $L_1$ may be selected from a direct linkage, a substituted or unsubstituted arylene group having 6 to 18 carbon atoms for forming a ring, and a substituted or unsubstituted heteroarylene group having 5 to 15 carbon atoms for forming a ring.

According to the embodiment, the emission efficiency of the organic EL device may be improved further.

In an embodiment, the electron accepting material may have a lowest unoccupied molecular orbital (LUMO) level from about −9.0 eV to about −4.0 eV.

According to the embodiment, the emission efficiency of the organic EL device may be improved further.

In an embodiment, the anode-side hole transport layer may be adjacent to the anode.

According to the embodiment, the emission efficiency of the organic EL device may be improved further.

In an embodiment, the emission layer may include a luminescent material capable of emitting light via a singlet excited state.

According to the embodiment, the emission efficiency of the organic EL device may be improved further.

In an embodiment, the emission layer may include a compound represented by the following Formula 3:

Formula 3

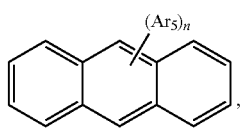

where, $Ar_5$ may be selected from hydrogen, deuterium, a substituted or unsubstituted alkyl group having 1 to 50 carbon atoms, a substituted or unsubstituted cycloalkyl group having 3 to 50 carbon atoms for forming a ring, a substituted or unsubstituted alkoxy group having 1 to 50 carbon atoms, a substituted or unsubstituted aralkyl group having 7 to 50 carbon atoms, a substituted or unsubstituted aryloxy group having 6 to 50 carbon atoms for forming a ring, a substituted or unsubstituted arylthio group having 6 to 50 carbon atoms for forming a ring, a substituted or unsubstituted alkoxycarbonyl group having 2 to 50 carbon atoms, a substituted or unsubstituted aryl group having 6 to 50 carbon atoms for forming a ring, a substituted or unsubstituted heteroaryl group having 5 to 50 carbon atoms for forming a ring, a substituted or unsubstituted silyl group, a carboxyl group, a halogen atom, a cyano group, a nitro group, and a hydroxyl group; and n may be an integer selected from 1 to 10.

According to the embodiment, the emission efficiency of the organic EL device may be improved further.

In an embodiment of the inventive concept, an organic EL device includes an anode; an emission layer; an anode-side hole transport layer between the anode and the emission layer and including an anode-side hole transport material doped with an electron accepting material; a middle hole transport material layer between the anode-side hole transport layer and the emission layer and including a middle hole transport material; and an emission layer-side hole transport layer between the middle hole transport material layer and the emission layer, the emission layer-side hole transport layer being adjacent to the emission layer and including an emission layer-side hole transport material represented by the following Formula 1:

Formula 1

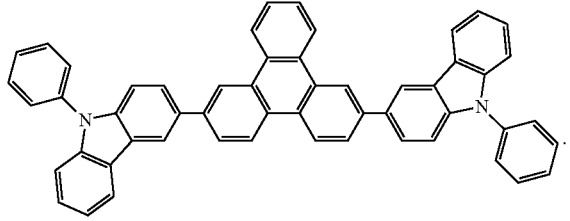

According to the embodiment, the emission life of the organic EL device may be improved.

In an embodiment, the middle hole transport material may be a compound represented by the following Formula 2:

Formula 2

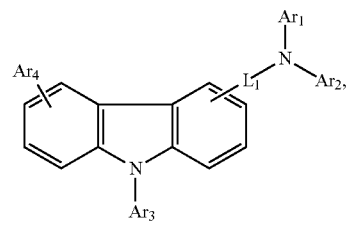

where $Ar_1$-$Ar_3$ may be each independently a substituted or unsubstituted aryl group having 6 to 50 carbon atoms for forming a ring, or a substituted or unsubstituted heteroaryl group having 5 to 50 carbon atoms for forming a ring; $Ar_4$ may be selected from hydrogen, deuterium, a halogen atom, a substituted or unsubstituted aryl group having 6 to 50 carbon atoms for forming a ring, a substituted or unsubstituted heteroaryl group having 5 to 50 carbon atoms for forming a ring, and a substituted or unsubstituted alkyl group having 1 to 50 carbon atoms; and $L_1$ may be selected from a direct linkage, a substituted or unsubstituted arylene group having 6 to 18 carbon atoms for forming a ring, and a substituted or unsubstituted heteroarylene group having 5 to 15 carbon atoms for forming a ring.

According to the embodiment, the emission life of the organic EL device may be improved further.

In an embodiment, the electron accepting material may have a LUMO level from about −9.0 eV to about −4.0 eV.

According to the embodiment, the emission life of the organic EL device may be improved further.

In an embodiment, the anode-side hole transport layer may be adjacent to the anode.

According to the embodiment, the emission life of the organic EL device may be improved further.

In an embodiment, the anode-side hole transport material may be a compound represented by the above Formula 2.

According to the embodiment, the emission life of the organic EL device may be improved further.

In an embodiment, the emission layer may include a luminescent material capable of emitting light via a singlet excited state.

According to the embodiment, the emission life of the organic EL device may be improved further.

In an embodiment, the emission layer may include a compound represented by the following Formula 3:

Formula 3

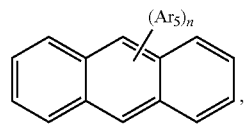

where, $Ar_5$ may be selected from hydrogen, deuterium, a substituted or unsubstituted alkyl group having 1 to 50 carbon atoms, a substituted or unsubstituted cycloalkyl group having 3 to 50 carbon atoms for forming a ring, a substituted or unsubstituted alkoxy group having 1 to 50 carbon atoms, a substituted or unsubstituted aralkyl group having 7 to 50 carbon atoms, a substituted or unsubstituted aryloxy group having 6 to 50 carbon atoms for forming a ring, a substituted or unsubstituted arylthio group having 6 to 50 carbon atoms for forming a ring, a substituted or unsubstituted alkoxycarbonyl group having 2 to 50 carbon atoms, a substituted or unsubstituted aryl group having 6 to 50 carbon atoms for forming a ring, a substituted or unsubstituted heteroaryl group having 5 to 50 carbon atoms for forming a ring, a substituted or unsubstituted silyl group, a carboxyl group, a halogen atom, a cyano group, a nitro group, and a hydroxyl group; and n may be an integer selected from 1 to 10.

According to the embodiment, the emission life of the organic EL device may be improved further.

BRIEF DESCRIPTION OF THE FIGURES

The accompanying drawing is included to provide a further understanding of the inventive concept, and is incorporated in and constitutes a part of this specification. The drawing illustrates example embodiments of the inventive concept and, together with the description, serves to explain principles of the inventive concept. The drawing is a diagram illustrating a schematic configuration of an organic EL device according to an embodiment of the inventive concept.

DETAILED DESCRIPTION

Example embodiments of the inventive concept will be described below in more detail with reference to the accompanying drawing. In the specification and drawing, elements having substantially the same function will be designated by the same reference numerals, and repeated explanation thereof will not be provided.

1-1. Configuration of Organic EL Device Including Anode-Side Hole Transport Layer Including Mainly Electron Accepting Material 1-1-1. Overall Configuration of the EL Device Hereinafter, the overall configuration of an organic EL device 100 according to an embodiment of the inventive concept will be described with reference to the drawing. As used herein, the expression "anode-side hole transport layer including mainly electron accepting material" may refer to the anode-side hole transport layer including no less than about 50 wt % of the electron accepting material relative to the total amount of the anode-side hole transport layer.

As shown in the drawing, an organic EL device 100 according to an embodiment may include a substrate 110, a first electrode 120 disposed (e.g., positioned) on the substrate 110, a hole transport layer 130 disposed on the first electrode 120, an emission layer 140 disposed on the hole transport layer 130, an electron transport layer 150 disposed on the emission layer 140, an electron injection layer 160 disposed on the electron transport layer 150 and a second electrode 170 disposed on the electron injection layer 160. Here, the hole transport layer 130 may be formed to have, for example, a multi-layer structure composed of a plurality of layers 131, 133 and 135.

1-1-2. Configuration of Substrate

The substrate 110 may be any substrate suitable for use in an organic EL device. For example, the substrate 110 may be a glass substrate, a semiconductor substrate or a transparent plastic substrate.

1-1-3. Configuration of First Electrode

The first electrode 120 may be an anode, and may be formed on the substrate 110 using an evaporation method, a sputtering method, etc. For example, the first electrode 120 may be formed using a metal, an alloy, a conductive compound, etc., having large work function. When the first electrode 120 is a transmission electrode, the first electrode 120 may be formed using indium tin oxide ($In_2O_3$—$SnO_2$ (ITO)), indium zinc oxide ($In_2O_3$—ZnO), tin oxide ($SnO_2$), zinc oxide (ZnO), etc., having good transparency and conductivity. In addition, the first electrode 120 may be formed as a reflection electrode by laminating magnesium (Mg), aluminum (Al), etc. on a transparent conductive layer.

1-1-4. Configuration of Hole Transport Layer

The hole transport layer 130 may include a hole transport material and may have hole transporting capabilities. The hole transport layer 130 may be formed on the first electrode 120, for example, to a layer thickness (total layer thickness in a multi-layer structure) of from about 10 nm to about 150 nm.

Here, the hole transport layer 130 of the organic EL device 100 according to an embodiment may be formed as a multi-layer by laminating (in a direction from the first electrode 120) an anode-side hole transport layer 131, a middle hole transport material layer 133, and an emission layer-side hole transport layer 135 one by one. The ratio of the thicknesses of the layers in the hole transport layer 130 is not specifically limited.

1-1-4-1. Configuration of Anode-Side Hole Transport Layer

The anode-side hole transport layer 131 may be a layer including mainly an electron accepting material. For example, the anode-side hole transport layer 131 may be formed on the first electrode 120.

In addition to the electron accepting material, the anode-side hole transport layer 131 may include materials other than the electron accepting material.

The anode-side hole transport layer 131 may be formed using mainly the electron accepting material, and may improve hole injection property from the first electrode 120. Therefore, the anode-side hole transport layer 131 may be provided near the first electrode 120, for example, adjacent to the first electrode 120.

The electron accepting material included in the anode-side hole transport layer 131 may be any suitable electron accepting material. In some embodiments, the electron accepting material included in the anode-side hole transport layer 131 may have a LUMO level from about −9.0 eV to about −4.0 eV, for example, the LUMO level from about −6.0 eV to about −4.0 eV.

Non-limiting examples of the electron accepting material having the LUMO level from about −9.0 eV to about −4.0 eV may include compounds represented by the following Formulae 4-1 to 4-14 (collectively denoted as Formula 4):

Formula 4

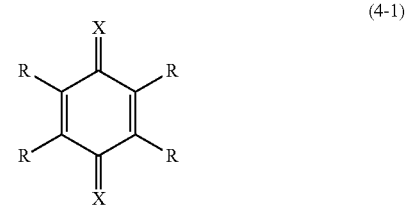

(4-1)

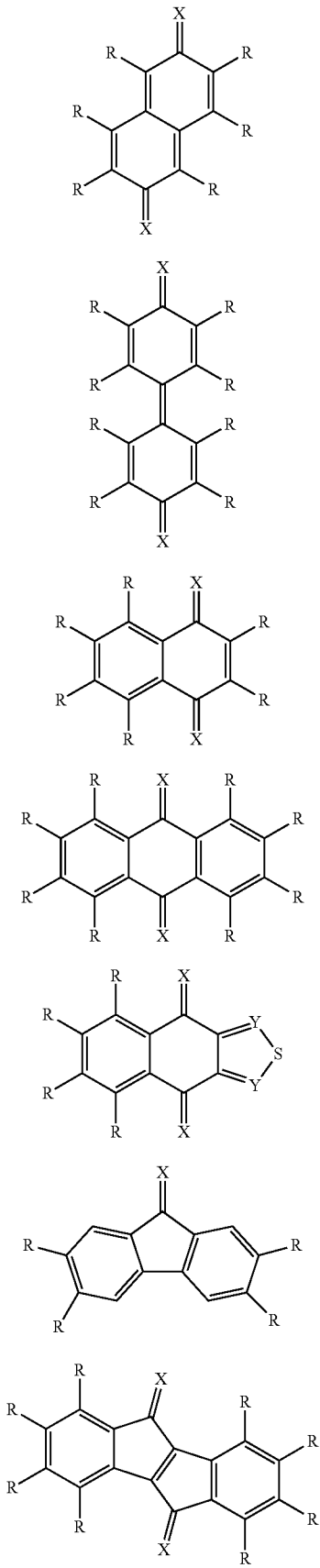

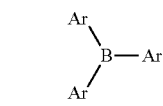

(4-2)

(4-3)

(4-4)

(4-5)

(4-6)

(4-7)

(4-8)

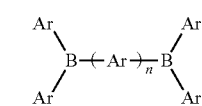

(4-9)

(4-10)

(4-11)

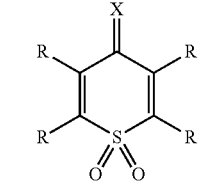

(4-12)

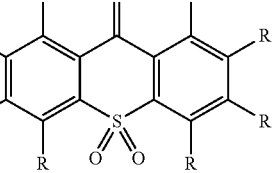

(4-13)

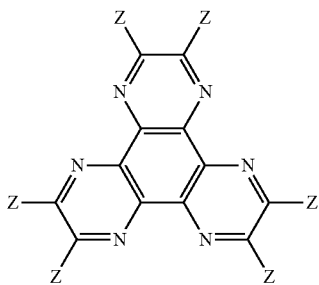

(4-14)

In the above Formulae 4-1 to 4-14, R may be selected from hydrogen, deuterium, a halogen atom, an alkyl fluoride having 1 to 50 carbon atoms, a cyano group, an alkoxy group having 1 to 50 carbon atoms, an alkyl group having 1 to 50 carbon atoms, an aryl group having 6 to 50 carbon atoms for forming a ring, and a heteroaryl group having 5 to 50 carbon atoms for forming a ring. Ar may be selected from a substituted aryl group with an electron withdrawing group, an unsubstituted aryl group having 6 to 50 carbon atoms for forming a ring, and a substituted or unsubstituted heteroaryl group having 5 to 50 carbon atoms for forming a ring; Y may be a methine group (—CH═) or a nitrogen atom (—N═); Z may be a pseudohalogen (e.g., a pseudohalogen group) or may include sulfur (S) (e.g., Z may be a sulfur-containing group); n may be an integer of 10 or less; and X may be one of substituents represented by the following Formulae X1 to X7 (collectively denoted as Formula 5).

Formula 5

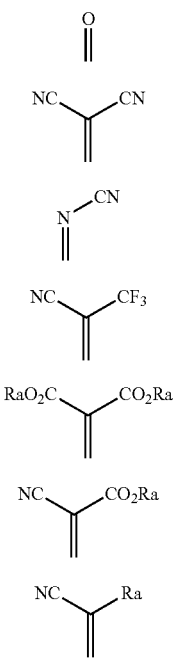

In Formulae X1 to X7, Ra may be selected from hydrogen, deuterium, a halogen atom, an alkyl fluoride having 1 to 50 carbon atoms, a cyano group, an alkoxy group having 1 to 50 carbon atoms, an alkyl group having 1 to 50 carbon atoms, a substituted or unsubstituted aryl group having 6 to 50 carbon atoms for forming a ring, and a substituted or unsubstituted heteroaryl group having 5 to 50 carbon atoms for forming a ring.

Non-limiting examples of the substituted or unsubstituted aryl group having 6 to 50 carbon atoms for forming a ring, represented by, for example, R, Ar and/or Ra, may include a phenyl group, a 1-naphthyl group, a 2-naphthyl group, a 1-anthryl group, a 2-anthryl group, a 9-anthryl group, a 1-phenanthryl group, a 2-phenanthryl group, a 3-phenanthryl group, a 4-phenanthryl group, a 9-phenanthryl group, a 1-naphthacenyl group, a 2-naphthacenyl group, a 9-naphthacenyl group, a 1-pyrenyl group, a 2-pyrenyl group, a 4-pyrenyl group, a 2-biphenyl group, a 3-biphenyl group, a 4-biphenyl group, a p-terphenyl-4-yl group, a p-terphenyl-3-yl group, a p-terphenyl-2-yl group, an m-terphenyl-4-yl group, an m-terphenyl-3-yl group, an m-terphenyl-2-yl group, an o-tolyl group, an m-tolyl group, a p-tolyl group, a p-t-butylphenyl group, a p-(2-phenylpropyl)phenyl group, a 3-methyl-2-naphthyl group, a 4-methyl-1-naphthyl group, a 4-methyl-1-anthryl group, a 4'-methylbiphenyl group, a 4"-t-butyl-p-terphenyl-4-yl group, a fluoranthenyl group, a fluorenyl group, etc.

Non-limiting examples of the substituted or unsubstituted heteroaryl group having 5 to 50 carbon atoms for forming a ring, represented by, for example, R, Ar and/or Ra, may include a 1-pyrrolyl group, a 2-pyrrolyl group, a 3-pyrrolyl group, a pyrazinyl group, a 2-pyridinyl group, a 3-pyridinyl group, a 4-pyridinyl group, a 1-indolyl group, a 2-indolyl group, a 3-indolyl group, a 4-indolyl group, a 5-indolyl group, a 6-indolyl group, a 7-indolyl group, a 1-isoindolyl group, a 2-isoindolyl group, a 3-isoindolyl group, a 4-isoindolyl group, a 5-isoindolyl group, a 6-isoindolyl group, a 7-isoindolyl group, a 2-furyl group, a 3-furyl group, a 2-benzofuranyl group, a 3-benzofuranyl group, a 4-benzofuranyl group, a 5-benzofuranyl group, a 6-benzofuranyl group, a 7-benzofuranyl group, a 1-isobenzofuranyl group, a 3-isobenzofuranyl group, a 4-isobenzofuranyl group, a 5-isobenzofuranyl group, a 6-isobenzofuranyl group, a 7-isobenzofuranyl group, a quinolyl group, a 3-quinolyl group, a 4-quinolyl group, a 5-quinolyl group, a 6-quinolyl group, a 7-quinolyl group, an 8-quinolyl group, a 1-isoquinolyl group, a 3-isoquinolyl group, a 4-isoquinolyl group, a 5-isoquinolyl group, a 6-isoquinolyl group, a 7-isoquinolyl group, an 8-isoquinolyl group, a 2-quinoxalinyl group, a 5-quinoxalinyl group, a 6-quinoxalinyl group, a 1-carbazolyl group, a 2-carbazolyl group, a 3-carbazolyl group, a 4-carbazolyl group, a 9-carbazolyl group, a 1-phenanthridinyl group, a 2-phenanthridinyl group, a 3-phenanthridinyl group, a 4-phenanthridinyl group, a 6-phenanthridinyl group, a 7-phenanthridinyl group, an 8-phenanthridinyl group, a 9-phenanthridinyl group, a 10-phenanthridinyl group, a 1-acridinyl group, a 2-acridinyl group, a 3-acridinyl group, a 4-acridinyl group, a 9-acridinyl group, a 1,7-phenanthroline-2-yl group, a 1,7-phenanthroline-3-yl group, a 1,7-phenanthroline-4-yl group, a 1,7-phenanthroline-5-yl group, a 1,7-phenanthroline-6-yl group, a 1,7-phenanthroline-8-yl group, a 1,7-phenanthroline-9-yl group, a 1,7-phenanthroline-10-yl group, a 1,8-phenanthroline-2-yl group, a 1,8-phenanthroline-3-yl group, a 1,8-phenanthroline-4-yl group, a 1,8-phenanthroline-5-yl group, a 1,8-phenanthroline-6-yl group, a 1,8-phenanthroline-7-yl group, a 1,8-phenanthroline-9-yl group, a 1,8-phenanthroline-10-yl group, a 1,9-phenanthroline-2-yl group, a 1,9-phenanthroline-3-yl group, a 1,9-phenanthroline-4-yl group, a 1,9-phenanthroline-5-yl group, a 1,9-phenanthroline-6-yl group, a 1,9-phenanthroline-7-yl group, a 1,9-phenanthroline-8-yl group, a 1,9-phenanthroline-10-yl group, a 1,10-phenanthroline-2-yl group, a 1,10-phenanthroline-3-yl group, a 1,10-phenanthroline-4-yl group, a 1,10-phenanthroline-5-yl group, a 2,9-phenanthroline-1-yl group, a 2,9-phenanthroline-3-yl group, a 2,9-phenanthroline-4-yl group, a 2,9-phenanthroline-5-yl group, a 2,9-phenanthroline-6-yl group, a 2,9-phenanthroline-7-yl group, a 2,9-phenanthroline-8-yl group, a 2,9-phenanthroline-10-yl group, a 2,8-phenanthroline-1-yl group, a 2,8-phenanthroline-3-yl group, a 2,8-phenanthroline-4-yl group, a 2,8-phenanthroline-5-yl group, a 2,8-phenanthroline-6-yl group, a 2,8-phenanthroline-7-yl group, a 2,8-phenanthroline-9-yl group, a 2,8-phenanthroline-10-yl group, a 2,7-phenanthroline-1-yl group, a 2,7-phenanthroline-3-yl group, a 2,7-phenanthroline-4-yl group, a 2,7-phenanthroline-5-yl group, a 2,7-phenanthroline-6-yl group, a 2,7-phenanthroline-8-yl group, a 2,7-phenanthroline-9-yl group, a 2,7-phenanthroline-10-yl group, a 1-phenazinyl group, a 2-phenazinyl group, a 1-phenothiazinyl group, a 2-phenothiazinyl group, a 3-phenothiazinyl group, a 4-phenothiazinyl group, a 10-phenothiazinyl group, a 1-phenoxazinyl group, a 2-phenoxazinyl group, a 3-phenoxazinyl group, a 4-phenoxazinyl group, a 10-phenoxazinyl group, a 2-oxazolyl group, a 4-oxazolyl group, a 5-oxazolylyl group, a 2-oxadiazolyl group, a 5-oxadiazolyl group, a 3-furazanyl group, a 2-thienyl group, a 3-thienyl group, a 2-methylpyrrole-1-yl group, a 2-methylpyrrole-3-yl group, a 2-methylpyrrole-4-yl group, a 2-methylpyrrole-5-yl group, a 3-methylpyrrole-1-yl group, a 3-methylpyrrole-2-yl group, a 3-methylpyrrole-4-yl group, a 3-methylpyrrole-5-yl group, a 2-t-butylpyrrole-4-yl group, a 3-(2-phenylpropyl)pyrrole-1-yl group, a 2-methyl-1-indolyl group, a 4-methyl-1-indolyl group, a 2-methyl-3-indolyl group, a 4-methyl-3- indolyl group, a 2-t-butyl-1-indolyl group, a 4-t-butyl-1-indolyl group, a 2-t-butyl-3-indolyl group, a 4-t-butyl-3-indolyl group, etc.

Non-limiting examples the substituted or unsubstituted alkyl fluoride group having 1 to 50 carbon atoms, represented by, for example, R and/or Ra, may include a perfluoroalkyl group (such as a trifluoromethyl group, a pentafluoroethyl group, a heptafluoropropyl group, and/or a heptadecafluorooctane group), a monofluoromethyl group, a difluoromethyl group, a trifluoroethyl group, a tetrafluoropropyl group, an octafluoropentyl group, etc.

Non-limiting examples of the substituted or unsubstituted alkyl group having 1 to 50 carbon atoms, represented by, for example R and/or Ra, may include a methyl group, an ethyl group, a propyl group, an isopropyl group, an n-butyl group, an s-butyl group, an isobutyl group, a t-butyl group, an n-pentyl group, an n-hexyl group, an n-heptyl group, an n-octyl group, a hydroxymethyl group, a 1-hydroxyethyl group, a 2-hydroxyethyl group, a 2-hydroxyisobutyl group, a 1,2-dihydroxyethyl group, a 1,3-dihydroxyisopropyl group, a 2,3-dihydroxy-t-butyl group, a 1,2,3-trihydroxypropyl group, a chloromethyl group, a 1-chloroethyl group, a 2-chloroethyl group, a 2-chloroisobutyl group, a 1,2-dichloroethyl group, a 1,3-dichloroisopropyl group, a 2,3-dichloro-t-butyl group, a 1,2,3-trichloropropyl group, a bromomethyl group, a 1-bromoethyl group, a 2-bromoethyl group, a 2-bromoisobutyl group, a 1,2-dibromoethyl group, a 1,3-dibromoisopropyl group, a 2,3-dibromo-t-butyl group, a 1,2,3-tribromopropyl group, an iodomethyl group, a 1-iodoethyl group, a 2-iodoethyl group, a 2-iodoisobutyl group, a 1,2-diiodoethyl group, a 1,3-diiodoisopropyl group, a 2,3-diiodo-t-butyl group, a 1,2,3-triiodopropyl group, an aminomethyl group, a 1-aminoethyl group, a 2-aminoethyl group, a 2-aminoisobutyl group, a 1,2-diaminoethyl group, a 1,3-diaminoisopropyl group, a 2,3-diamino-t-butyl group, a 1,2,3-triaminopropyl group, a cyanomethyl group, a 1-cyanoethyl group, a 2-cyanoethyl group, a 2-cyanoisobutyl group, a 1,2-dicyanoethyl group, a 1,3-dicyanoisopropyl group, a 2,3-dicyano-t-butyl group, a 1,2,3-tricyanopropyl group, a nitromethyl group, a 1-nitroethyl group, a 2-nitroethyl group, a 2-nitroisobutyl group, a 1,2-dinitroethyl group, a 1,3-dinitroisopropyl group, a 2,3-dinitro-t-butyl group, a 1,2,3-trinitropropyl group, a cyclopropyl group, a cyclobutyl group, a cyclopentyl group, a cyclohexyl group, a 4-methylcyclohexyl group, a 1-adamantyl group, a 2-adamantyl group, a 1-norbornyl group, a 2-norbornyl group, etc.

The substituted or unsubstituted alkoxy group having 1 to 50 carbon atoms, represented by, for example, R and/or Ra, may be a group represented by —OY. Non-limiting examples of Y may include a methyl group, an ethyl group, a propyl group, an isopropyl group, an n-butyl group, an s-butyl group, an isobutyl group, a t-butyl group, an n-pentyl group, an n-hexyl group, an n-heptyl group, an n-octyl group, a hydroxymethyl group, a 1-hydroxyethyl group, a 2-hydroxyethyl group, a 2-hydroxyisobutyl group, a 1,2-dihydroxyethyl group, a 1,3-dihydroxyisopropyl group, a 2,3-dihydroxy-t-butyl group, a 1,2,3-trihydroxypropyl group, a chloromethyl group, a 1-chloroethyl group, a 2-chloroethyl group, a 2-chloroisobutyl group, a 1,2-dichloroethyl group, a 1,3-dichloroisopropyl group, a 2,3-dichloro-t-butyl group, a 1,2,3-trichloropropyl group, a bromomethyl group, a 1-bromoethyl group, a 2-bromoethyl group, a 2-bromoisobutyl group, a 1,2-dibromoethyl group, a 1,3-dibromoisopropyl group, a 2,3-dibromo-t-butyl group, a 1,2,3-tribromopropyl group, an iodomethyl group, a 1-iodoethyl group, a 2-iodoethyl group, a 2-iodoisobutyl group, a 1,2-diiodoethyl group, a 1,3-diiodoisopropyl group, a 2,3-diiodo-t-butyl group, a 1,2,3-triiodopropyl group, an aminomethyl group, a 1-aminoethyl group, a 2-aminoethyl group, a 2-aminoisobutyl group, a 1,2-diaminoethyl group, a 1,3-diaminoisopropyl group, a 2,3-diamino-t-butyl group, a 1,2,3-triaminopropyl group, a cyanomethyl group, a 1-cyanoethyl group, a 2-cyanoethyl group, a 2-cyanoisobutyl group, a 1,2-dicyanoethyl group, a 1,3-dicyanoisopropyl group, a 2,3-dicyano-t-butyl group, a 1,2,3-tricyanopropyl group, a nitromethyl group, a 1-nitroethyl group, a 2-nitroethyl group, a 2-nitroisobutyl group, a 1,2-dinitroethyl group, a 1,3-dinitroisopropyl group, a 2,3-dinitro-t-butyl group, a 1,2,3-trinitropropyl group, etc.

Non-limiting examples of the halogen atom represented by, for example, R and/or Ra, may include fluorine (F), chlorine (Cl), bromine (Br), iodine (I), etc.

In some embodiments, the electron accepting material may include the following Compounds 4-15 and 4-16 (collectively denoted as Formula 6). The LUMO level of Compound 4-15 may be about −4.40 eV, and the LUMO level of Compound 4-16 may be about −5.20 eV. However, the electron accepting material used in the organic EL device according to the inventive concept is not limited to the following Compounds 4-15 and 4-16.

Formula 6

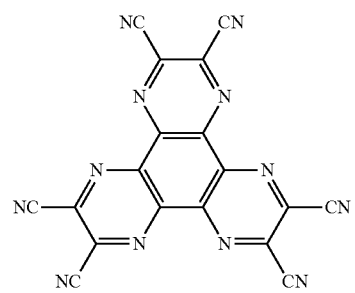
(4-15)

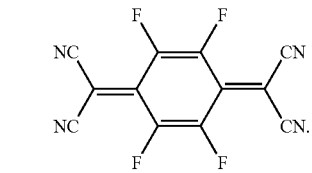
(4-16)

1-1-4-2. Configuration of Middle Hole Transport Material Layer

The middle hole transport material layer 133 may include a middle hole transport material. The middle hole transport material layer 133 may be formed, for example, on the anode-side hole transport layer 131.

The middle hole transport material included in the middle hole transport material layer 133 may be any suitable hole transport material. Non-limiting examples of the middle hole transport material for the middle hole transport material layer 133 may include 1,1-bis[(di-4-tolylamino)phenyl]cyclohexane (TAPC), a carbazole derivative (such as N-phenylcarbazole and/or polyvinylcarbazole), N,N'-bis(3-methylphenyl)-N,N'-diphenyl-[1,1-biphenyl]-4,4'-diamine (TPD), 4,4',4"-tris(N-carbazolyl)triphenylamine (TCTA), N,N'-di(1-naphthyl)-N,N'-diphenylbenzidine (NPB), etc.

In some embodiments, the middle hole transport material may be a compound represented by the following Formula 2:

Formula 2

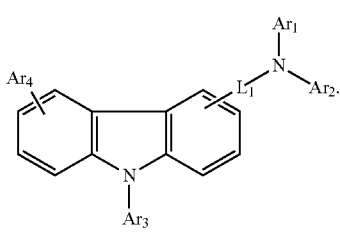

In the above Formula 2, $Ar_1$-$Ar_3$ may be each independently a substituted or unsubstituted aryl group having 6 to 50 carbon atoms for forming a ring, or a substituted or unsubstituted heteroaryl group having 5 to 50 carbon atoms for forming a ring.

$Ar_4$ may be selected from hydrogen, deuterium, a halogen atom, a substituted or unsubstituted aryl group having 6 to 50 carbon atoms for forming a ring, a substituted or unsubstituted heteroaryl group having 5 to 50 carbon atoms for forming a ring, and a substituted or unsubstituted alkyl group having 1 to 50 carbon atoms.

$L_1$ may be selected from a direct linkage, a substituted or unsubstituted arylene group having 6 to 18 carbon atoms for forming a ring, and a substituted or unsubstituted heteroarylene group having 5 to 15 carbon atoms for forming a ring. Here, the expression "direct linkage" may refer to a bond such as a single bond.

Non-limiting examples of $Ar_1$-$Ar_3$ may include a phenyl group, a biphenyl group, a terphenyl group, a naphthyl group, an anthryl group, a phenanthryl group, a fluorenyl group, an indenyl group, a fluoranthenyl group, a triphenylenyl group, a pyridyl group, a furanyl group, a pyranyl group, a thienyl group, a quinolyl group, an isoquinolyl group, a benzofuranyl group, a benzothienyl group, an indolyl group, a carbazolyl group, a benzoxazolyl group, a benzothiazolyl group, a quinoxalyl group, a benzoimidazolyl group, a pyrazolyl group, a dibenzofuranyl group, a dibenzothienyl group, etc. In some embodiments, $Ar_1$-$Ar_3$ may each independently include the phenyl group, the biphenyl group, the terphenyl group, the fluorenyl group, the carbazolyl group, the dibenzofuranyl group, etc.

Non-limiting examples of $Ar_4$ may include a phenyl group, a biphenyl group, a terphenyl group, a naphthyl group, an anthryl group, a phenanthryl group, a fluorenyl group, an indenyl group, a pyrenyl group, a fluoranthenyl group, a triphenylenyl group, a pyridyl group, a furanyl group, a pyranyl group, a thienyl group, a quinolyl group, an isoquinolyl group, a benzofuranyl group, a benzothienyl group, an indolyl group, a carbazolyl group, a benzoxazolyl group, a benzothiazolyl group, a quinoxalyl group, a benzoimidazolyl group, a pyrazolyl group, a dibenzofuranyl group, a dibenzothienyl group, a methyl group, an ethyl group, a propyl group, an isopropyl group, an n-butyl group, etc. In some embodiments, $Ar_4$ may include the phenyl group, the biphenyl group, the terphenyl group, the fluorenyl group, the carbazolyl group, the dibenzofuranyl group, etc.

Non-limiting examples of $L_1$, other than the direct linkage, may include a phenylene group, a biphenylene group, a terphenylene group, a naphthylene group, an anthrylene group, a phenanthrenylene group, a fluorenylene group, an indenylene group, a pyrenylene group, a fluoranthenylene group, a triphenylenylene group, a pyridylene group, a furanylene group, a pyranylene group, a thienylene group, a quinolylene group, an isoquinolylene group, a benzofuranylene group, a benzothienylene group, an indolylene group, a carbazolylene group, a benzoxazolylene group, a benzothiazolylene group, a quinoxalylene group, a benzoimidazolylene group, a pyrazolylene group, a dibenzofuranylene group, a dibenzothienylene group, etc. In some embodiments, $L_1$ may include the direct linkage, the phenylene group, the biphenylene group, the terphenylene group, the fluorenylene group, the carbazolylene group, and/or the dibenzofuranylene group.

Non-limiting examples of the compound represented by Formula 2 may include the following Compounds 2-1 to 2-16 (collectively denoted as Formula 7). However, the compound represented by Formula 2 is not limited to the following Compounds 2-1 to 2-16.

Formula 7

(2-1)

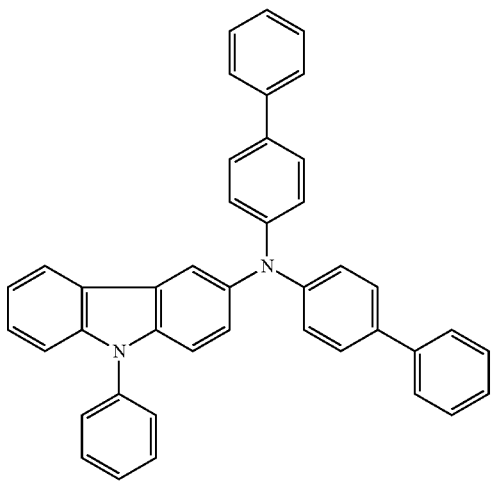

(2-2)

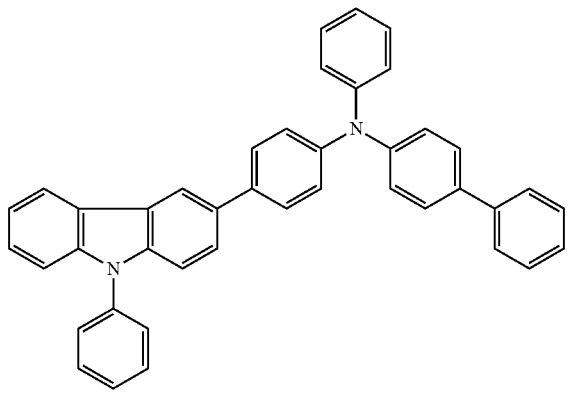

(2-3)

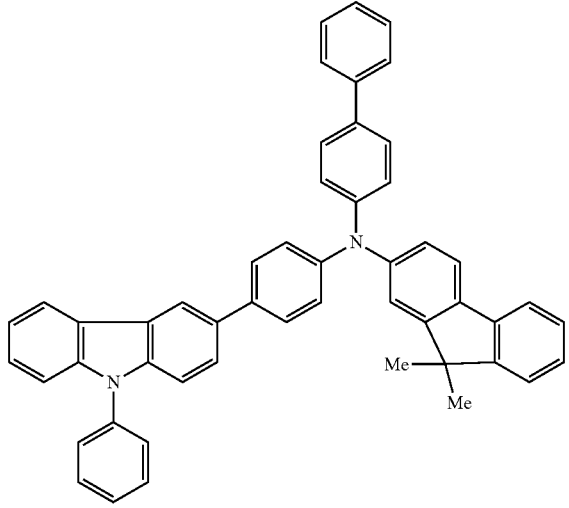

(2-4)
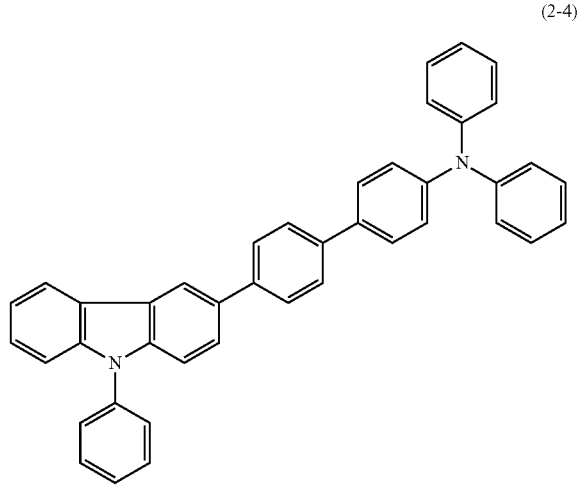
(2-7)
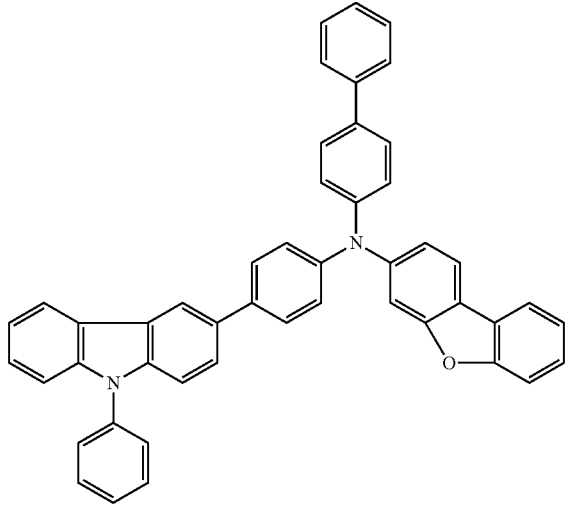
(2-5)
(2-8)
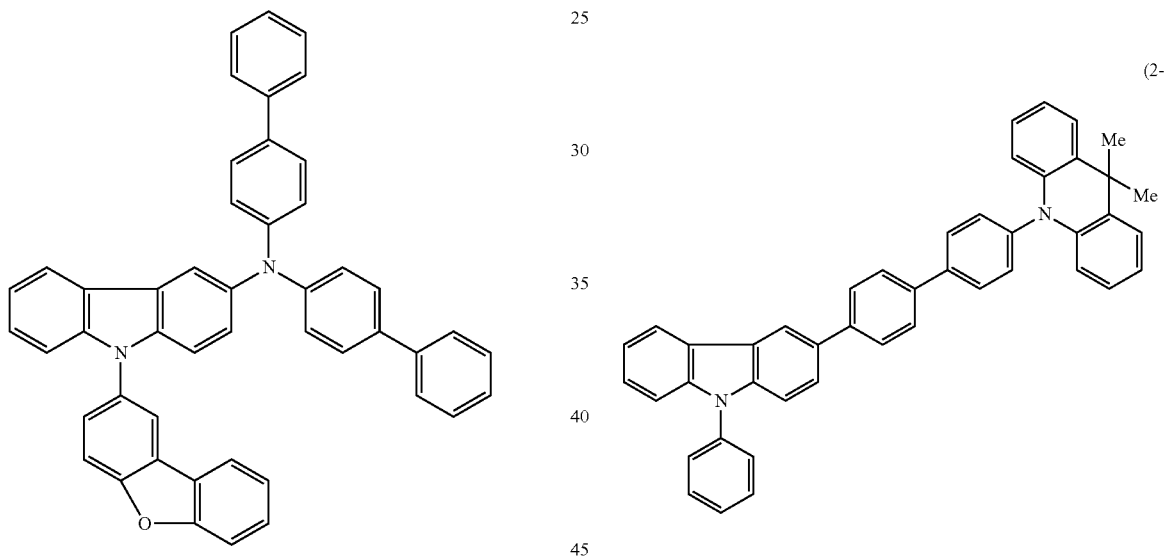
(2-6)
(2-9)
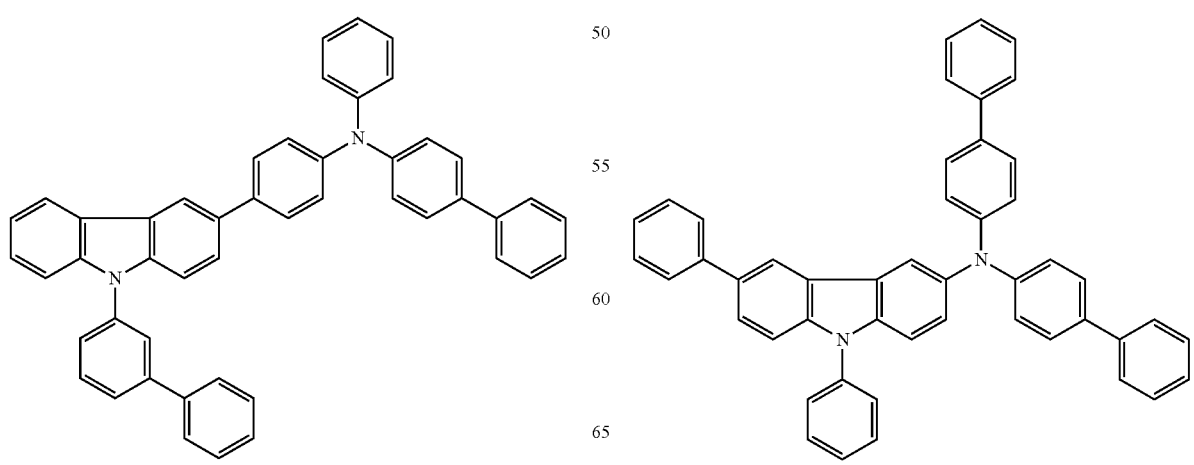

(2-10)
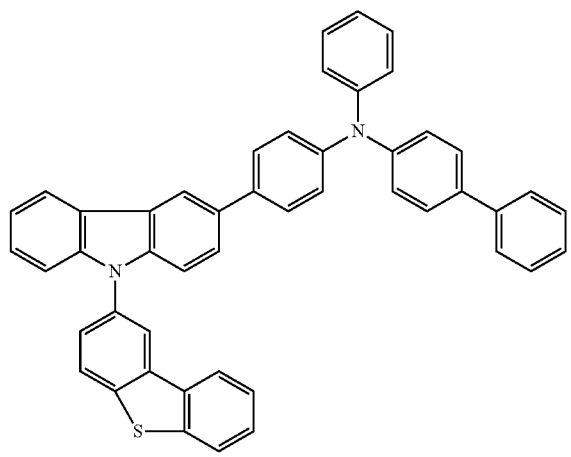
(2-11)
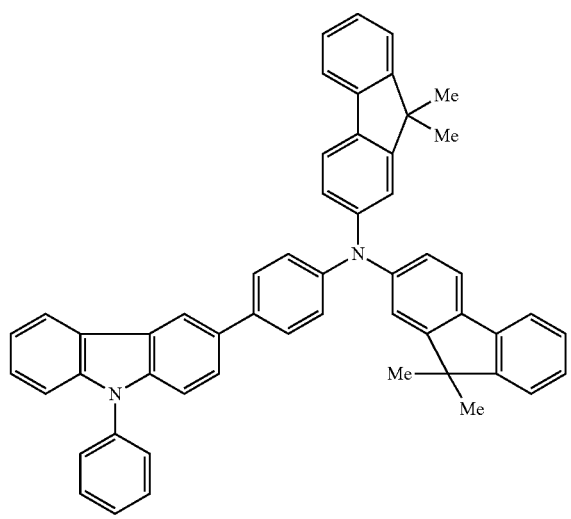
(2-12)
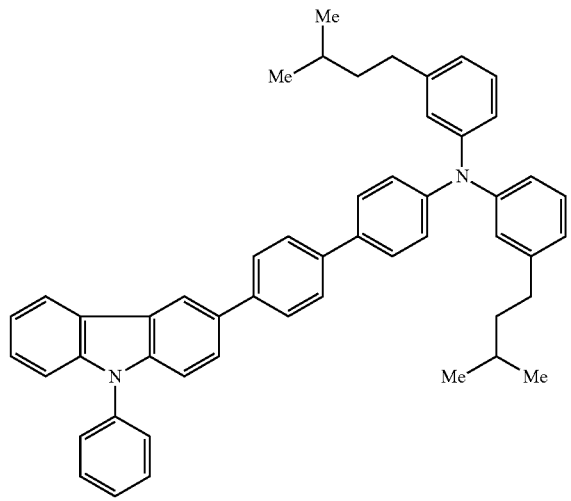
(2-13)
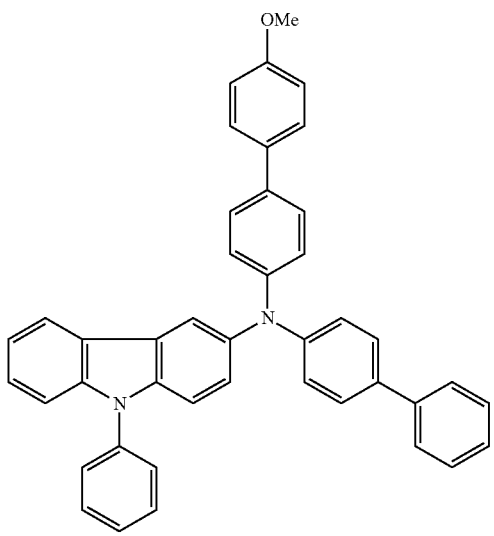
(2-14)
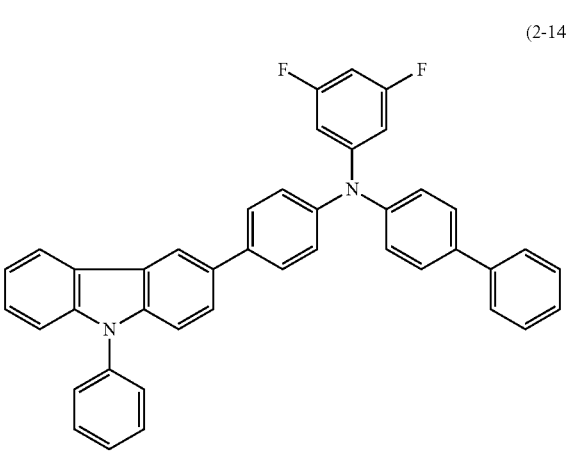
(2-15)
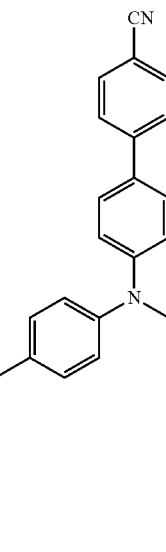

(2-16)

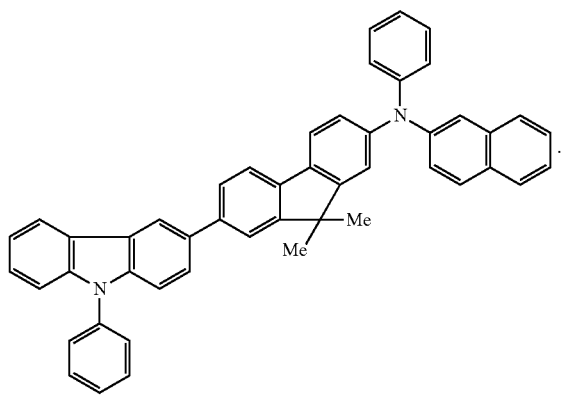

The middle hole transport material layer 133 may include the compound represented by the above Formula 2 as the middle hole transport material, thereby improving the hole transporting property. Further, the emission efficiency of the organic EL device 100 may be improved.

1-1-4-3. Configuration of Emission Layer-Side Hole Transport Layer

The emission layer-side hole transport layer 135 may include a compound represented by the following Formula 1. The emission layer-side hole transport layer 135 may be formed, for example, on the middle hole transport material layer 133, and may be adjacent to the emission layer 140.

Formula 1

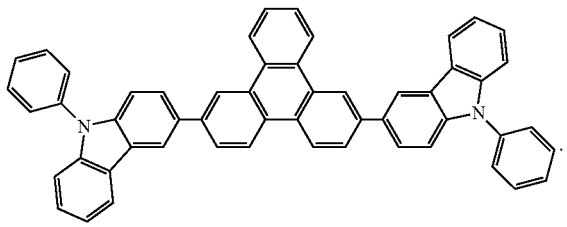

The emission layer-side hole transport layer 135 may include the compound represented by the above Formula 1 as the emission layer-side hole transport material and may protect the hole transport layer 130 from electrons not consumed in the emission layer 140. In addition, when the emission layer-side hole transport layer 135 includes the compound represented by Formula 1, the diffusion of the energy in an excited state (e.g., excitons) generated in the emission layer 140 into the hole transport layer 130 may be prevented or reduced. Therefore, according to this configuration, the emission layer-side hole transport layer 135 may improve the current flow durability of the hole transport layer 130.

The emission layer-side hole transport layer 135 may be formed around (e.g., near) the emission layer 140, and in some embodiments may be adjacent to the emission layer 140, to effectively (or suitably) prevent or reduce the diffusion of electrons or energy (e.g., excitons) from the emission layer 140.

In addition, when the emission layer-side hole transport layer 135 includes the compound represented by Formula 1, the charge balance of the organic EL device 100 may be controlled, and the diffusion of the electron accepting material included in the anode-side hole transport layer 131 into the emission layer 140 may be restrained or reduced. Accordingly, the emission layer-side hole transport layer 135 may improve the charge transport property of the hole transport layer 130.

According to embodiments of the present disclosure, when the emission layer-side hole transport layer 135 includes the compound represented by Formula 1, the charge transport property and current flow durability of the hole transport layer 130 may be improved, thereby improving the emission efficiency of the organic EL device 100.

1-1-5. Configuration of Emission Layer

The emission layer 140 may include a host material, a dopant material as a luminescent material, etc., and may emit light via fluorescence or phosphorescence. The emission layer 140 may be formed, for example, on the hole transport layer 130 to a layer thickness from about 10 nm to about 60 nm.

The host material and the dopant material included in the emission layer 140 may include any suitable host material and dopant material. For example, the emission layer 140 may include a fluoranthene derivative, a styrene derivative, a pyrene derivative, an arylacetylene derivative, a fluorene derivative, a perylene derivative, a chrysene derivative, an anthracene derivative, etc., as the host material and/or the dopant material.

In some embodiments, the emission layer 140 may include a luminescent material emitting light via a singlet excited state, for example, the emission layer 140 may include a compound represented by the following Formula 3:

Formula 3

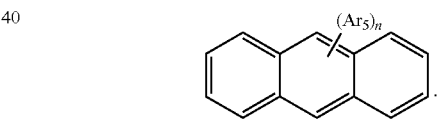

In Formula 3, $Ar_5$ may be selected from hydrogen, deuterium, a substituted or unsubstituted alkyl group having 1 to 50 carbon atoms, a substituted or unsubstituted cycloalkyl group having 3 to 50 carbon atoms for forming a ring, a substituted or unsubstituted alkoxy group having 1 to 50 carbon atoms, a substituted or unsubstituted aralkyl group having 7 to 50 carbon atoms, a substituted or unsubstituted aryloxy group having 6 to 50 carbon atoms for forming a ring, a substituted or unsubstituted arylthio group having 6 to 50 carbon atoms for forming a ring, a substituted or unsubstituted alkoxycarbonyl group having 2 to 50 carbon atoms, a substituted or unsubstituted aryl group having 6 to 50 carbon atoms for forming a ring, a substituted or unsubstituted heteroaryl group having 5 to 50 carbon atoms for forming a ring, a substituted or unsubstituted silyl group, a carboxyl group, a halogen atom, a cyano group, a nitro group, and a hydroxyl group; and n may be an integer selected from 1 to 10.

Non-limiting examples of the compound represented by Formula 3 may include the following Compounds 3-1 to 3-12 (collectively denoted as Formula 8). However, the compound represented by Formula 3 is not limited to the following Compounds 3-1 to 3-12. For example, the emission layer may include at least one compound represented by the following Formula 8.
Formula 8
(3-1)
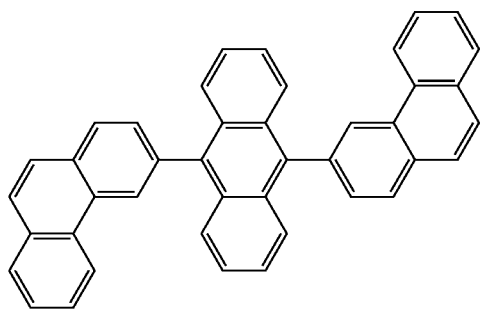
(3-2)
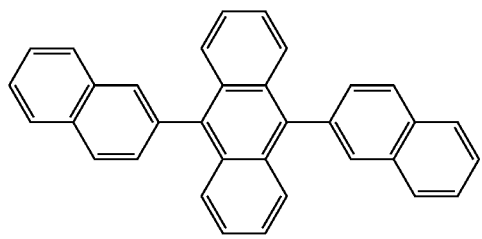
(3-3)
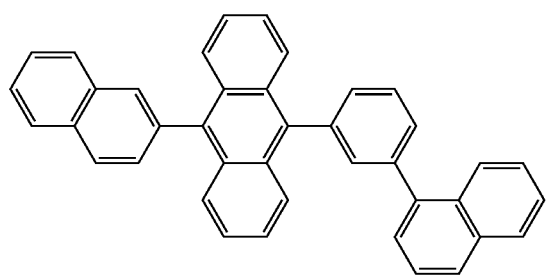
(3-4)
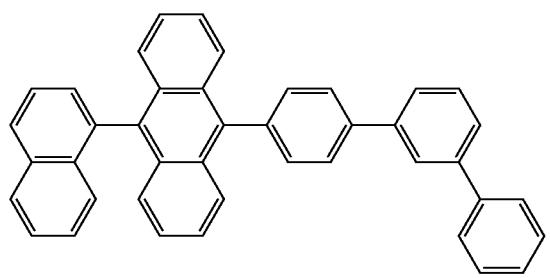
(3-5)
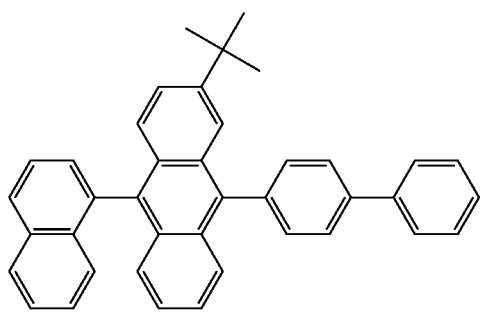
-continued
(3-6)
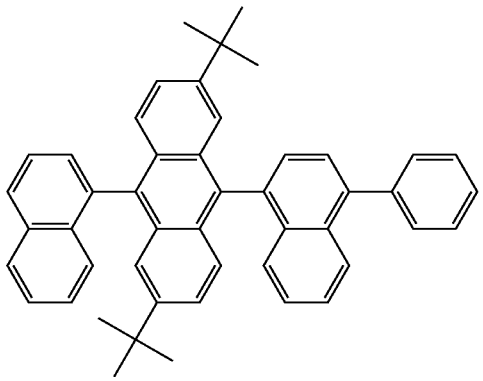
(3-7)
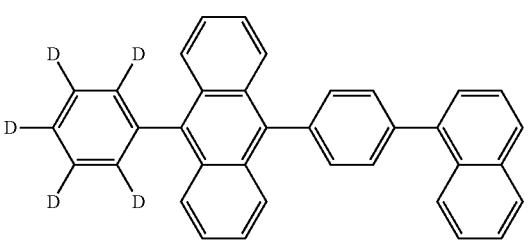
(3-8)
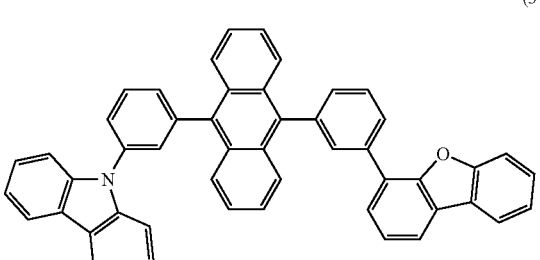
(3-9)
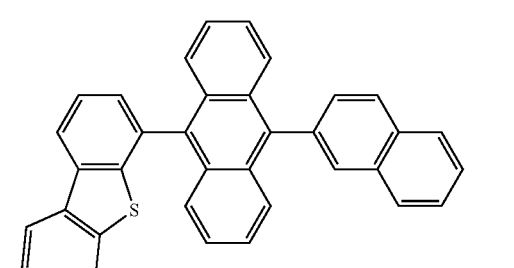
(3-10)
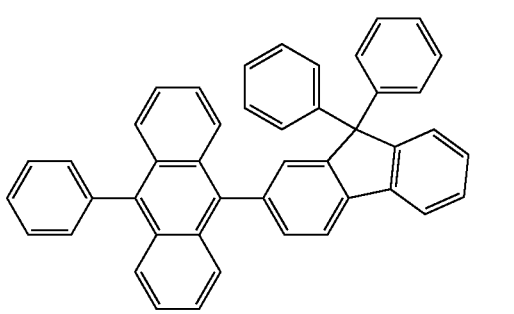

(3-11)

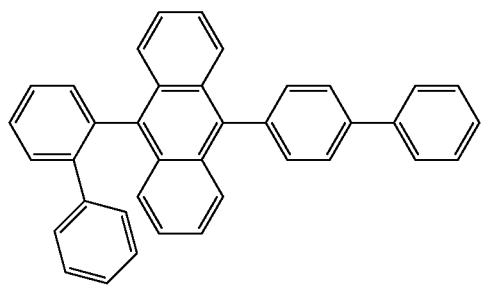

(3-12)

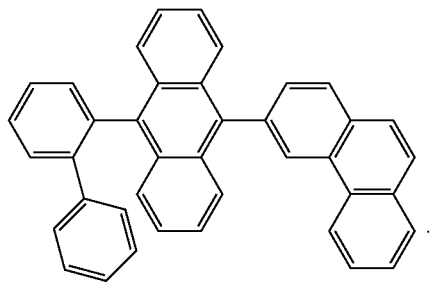

In the embodiments where the emission layer 140 includes the compound represented by Formula 3, the hole transport layer 130 may further improve hole injection property. Therefore, the emission properties of the organic EL device 100 may also be improved by including the compound represented by Formula 3 in the emission layer 140.

The emission layer 140 may include the compound represented by Formula 3 as a host material or as a dopant material.

In addition, the emission layer 140 may further include, for example, tris(8-quinolinolato)aluminum ($Alq_3$), 4,4'-bis(carbazole-9-yl)biphenyl (CBP), 4,4'-bis(9-carbazole)-2,2'-dimethyl-biphenyl (dmCBP), poly(n-vinylcarbazole) (PVK), 4,4',4"-tris(N-carbazolyl)triphenylamine (TCTA), 1,3,5-tris(N-phenylbenzimidazol-2-yl)benzene (TPBI), 3-t-butyl-9,10-di(naphth-2-yl)anthracene (TBADN), distyrylarylene (DSA), bis(2,2-diphenylvinyl)-1,1'-biphenyl (DPVBi), 1,4-bis[2-(3-N-ethylcarbazolyl)vinyl]benzene (BCzVB), 4-(di-p-tolylamino)-4'-[(di-p-tolylamino)styryl]stilbene (DPAVB), N-(4-((E)-2-(6-((E)-4-(diphenylamino)styryl)naphthalene-2-yl)vinyl)phenyl)-N-phenylbeneneamine (N-BDAVBi), 2,5,8,11-tetra-t-butylperylene (TBPe), 1,1-dipyrene, 1,4-dipyrenylbenzene, 1,4-bis(N,N-diphenylamino)pyrene, etc., as the host material or the dopant material.

In some embodiments, the emission layer 140 may be formed as an emission layer emitting light of a specific color. For example, the emission layer 140 may be formed as a red emitting layer, a green emitting layer, or a blue emitting layer.

In the case where the emission layer 140 is the blue emitting layer, suitable blue dopants may be used. For example, a perylene derivative, an iridium (Ir) complex (such as bis[2-(4,6-difluorophenyl)pyridinate]picolinate iridium(III) (Flrpic)), etc. may be used as a blue dopant.

In the case where the emission layer 140 is the red emitting layer, suitable red dopants may be used. For example, a rubrene derivative, 4-dicyanomethylene-2-(p-dimethylaminostyryl)-6-methyl-4H-pyrane (DCM), an iridium complex (such as bis(1-phenylisoquinoline)(acetylacetonate) iridium(III) ($Ir(piq)_2(acac)$)), an osmium (Os) complex, a platinum complex, etc. may be used as a red dopant.

In the case where the emission layer 140 is the green emitting layer, suitable green dopants may be used. For example, a coumarin derivative, an iridium complex (such as tris(2-phenylpyridine) iridium(III) ($Ir(ppy)_3$)), etc. may be used.

1-1-6. Configuration of Electron Transport Layer

The electron transport layer 150 may include an electron transport material and may have electron transporting capabilities. The electron transport layer 150 may be formed, for example, on the emission layer 140 to a layer thickness from about 15 nm to about 50 nm. The electron transport material included in the electron transport layer 150 may be any suitable electron transport material. Non-limiting examples of the electron transport material may include tris(8-quinolinolato)aluminum ($Alq_3$), a material having a nitrogen-containing aromatic ring, etc. Non-limiting examples of the material having a nitrogen-containing aromatic ring may include a material including a pyridine ring (such as 1,3,5-tri[(3-pyridyl)-phen-3-yl]benzene), a material including a triazine ring (such as 2,4,6-tris(3'-(pyridin-3-yl)biphenyl-3-yl)-1,3,5-triazine), a material including an imidazole ring (such as 2-(4-(N-phenylbenzoimidazolyl-1-yl-phenyl)-9,10-dinaphthylanthracene)), etc.

1-1-7. Configuration of Electron Injection Layer

The electron injection layer 160 can facilitate easy injection of electrons from a second electrode 170. The electron injection layer 160 may be formed, for example, on the electron transport layer 150 to a layer thickness from about 0.3 nm to about 9 nm. The electron injection layer 160 may be formed using any suitable material that may be used as a material for forming the electron injection layer 160. Non-limiting examples of the material for forming the electron injection layer 160 may include (8-quinolinato)lithium (Liq), lithium fluoride (LiF), sodium chloride (NaCl), cesium fluoride (CsF), lithium oxide ($Li_2O$), barium oxide (BaO), etc.

1-1-8. Configuration of Second Electrode

The second electrode 170 may be, for example, a cathode and may be formed on the electron injection layer 160 using an evaporation method and/or a sputtering method. For example, the second electrode 170 may be formed using a metal, an alloy, a conductive compound, etc., having small work function. The second electrode 170 may be formed using, for example, a metal (such as lithium (Li), magnesium (Mg), aluminum (Al), and/or calcium (Ca)), and/or a metal mixture (such as aluminum-lithium (Al—Li), magnesium-indium (Mg—In), magnesium-silver (Mg—Ag), etc.). In some embodiments, the second electrode 170 may be formed as a transmission electrode using a thin film of the metal material with a thickness of not more than about 20 nm, or using a transparent conductive layer such as ITO, indium tin oxide ($In_2O_3$—ZnO), etc.

1-1-9. Modification Example of Organic EL Device

While the structure of the organic EL device 100 according to an embodiment has been described with reference to the drawing, the structure of the organic EL device 100 is not limited thereto. For example, in the organic EL device 100 according to an embodiment, at least one layer may be formed as a multi-layer, or another layer, other than the above-described layers, may be additionally formed.

For example, in the organic EL device 100 according to an embodiment, a hole injection layer may be provided between the first electrode 120 and the hole transport layer 130.

The hole injection layer can facilitate easy hole injection from the first electrode 120. The hole injection layer may be formed, for example, on the first electrode 120 to a layer thickness from about 10 nm to about 150 nm. The hole injection layer may be formed using any suitable material that may be used for forming the hole injection layer. Non-limiting examples of the material for forming the hole injection layer may include a triphenylamine-containing poly(ether ketone) (TPAPEK), 4-isopropyl-4'-methyldiphenyliodonium tetrakis(pentafluorophenyl)borate (PPBI), N,N'-diphenyl-N,N'-bis-[4-(phenyl-m-tolyl-amino)-phenyl]-biphenyl-4,4'-diamine (DNTPD), copper phthalocyanine, 4,4',4''-tris(3-methylphenylphenylamino)triphenylamine (m-MTDATA), N,N'-di(1-naphthyl)-N,N'-diphenylbenzidine (NPB), 4,4',4''-tris{diphenylamino}triphenylamine (TDATA), 4,4',4''-tris(N,N-2-naphthylphenylamino)triphenylamine (2-TNATA), polyaniline/dodecylbenzenesulfonic acid, poly(3,4-ethylenedioxythiophene)/poly(4-styrenesulfonate), polyaniline/10-camphorsulfonic acid, etc.

1-1-10. Method of Manufacturing Organic EL Device Including Anode-Side Hole Transport Layer Including Mainly Electron Accepting Material Each layer of the organic EL device 100 according to an embodiment as described above may be formed by selecting one or more appropriate (or suitable) layer forming methods such as vacuum evaporation, sputtering and/or various coating methods according to the material used for forming each layer.

For example, a metal layer such as the first electrode 120, the second electrode 170, and/or the electron injection layer 160 may be formed using a deposition method (including an electron beam evaporation method, a hot filament evaporation method, and/or a vacuum deposition method), a sputtering method, and/or a plating method (such as an electroplating method and/or an electroless plating method).

Organic layers such as the hole transport layer 130, the emission layer 140, and/or the electron transport layer 150 may be formed using a physical vapor deposition (PVD) method (such as a vacuum deposition method), a printing method (such as a screen printing method and/or an ink jet printing method), a laser transcription method, and/or a coat method (such as a spin coat method).

EXAMPLES

1-2. Examples

Hereinafter, the organic EL devices according to example embodiments will be explained in more detail with reference to examples and comparative examples. However, the following examples are only for illustration, and the organic EL device according to example embodiments is not limited thereto.

1-2-1: Synthesis of Compound Represented by Formula 1

First, a synthesis method of a compound represented by Formula 1 will be explained. However, the synthesis method of the compound represented by Formula 1 is not limited thereto.

A compound represented by Formula 1 was synthesized according to the following Reaction 1 (denoted as Formula 9).

(Reaction 1)

Formula 9]

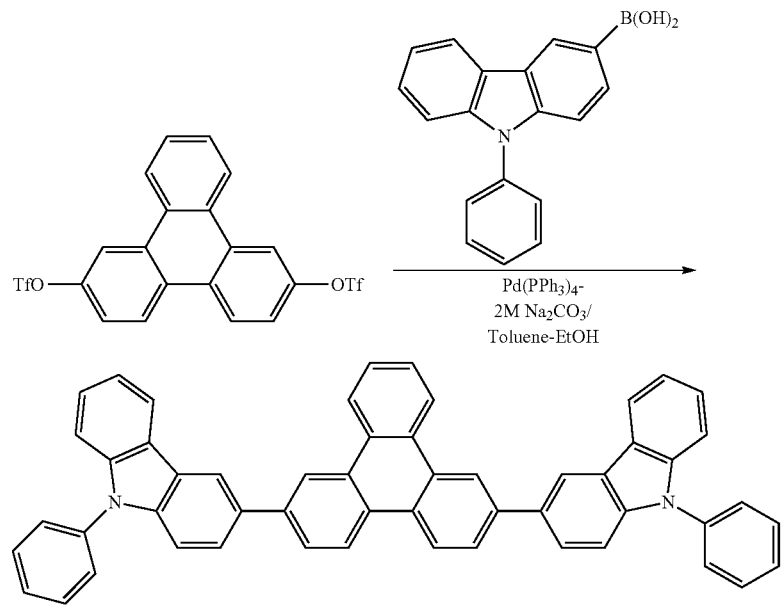

To a toluene suspension (200 ml) of 2,7-bis(trifluoromethanesulfonyloxy)triphenylene (9.46 g, 18.0 mmol), and 9-phenylcarbazol-3-boronic acid (10.9 g, 37.9 mmol), 2 M sodium carbonate ($Na_2CO_3$) aqueous solution (50 ml) and ethanol (EtOH) (10 ml) were added and degassed. Under an argon atmosphere, tetrakis(triphenylphosphine)palladium (0) ($Pd(PPh_3)_4$) (2.09 g, 1.80 mmol) was added to the degassed mixture, followed by stirring and refluxing the resulting mixture for about 8 hours. After the reaction was washed with each of water and toluene, the obtained precipitate was dissolved in a hot pyridine solvent and treated with activated carbon. The resulting pyridine solution was crystallized, and a target material of 2,7-bis(carbazol-3-yl)triphenylene (6.90 g, 53%) was obtained as a lemon yellow powder. The resulting product was identified by Fast atom bombardment mass spectrometry (FAB-MS) by confirming the ion peak (mass number 710) of the molecule.

1-2-2. Manufacture of Organic EL Device

Then, an organic EL device according to an embodiment was manufactured by the following manufacturing method.

First, with respect to an ITO-glass substrate patterned and washed in advance, surface treatment using UV-Ozone ($O_3$) was conducted. In addition, the layer thickness of an ITO layer (here, first electrode) on a glass substrate was about 150 nm. After ozone treatment, the substrate was washed and inserted into an evaporator for forming an organic layer, and an anode-side hole transport layer, a middle hole transport material layer, an emission layer-side hole transport layer, an emission layer and an electron transport layer were evaporated one by one at a vacuum degree of about $10^{-4}$ to about $10^{-5}$ Pa. The layer thickness of each of the anode-side hole transport layer, the middle hole transport material layer and the emission layer-side hole transport layer was about 10 nm. Each layer thickness of the emission layer and the electron transport layer was about 25 nm. Then, the substrate was moved into an evaporator for forming a metal layer, and the electron injection layer and the second electrode were evaporated at a vacuum degree of about $10^{-4}$ to about $10^{-5}$ Pa. The layer thickness of the electron injection layer was about 1 nm and the layer thickness of the second electrode was about 100 nm.

Here, the anode-side hole transport layer, the middle hole transport material layer and the emission layer-side hole transport layer together formed the hole transport layer with a multi-layer structure. The anode-side hole transport layer, the middle hole transport material layer and the emission layer-side hole transport layer were manufactured in examples and comparative examples using the materials shown in the following Table 1.

In Table 1, Compound 1 refers to 2,7-bis(carbazol-3-yl)triphenylene, the synthesis method of which was explained above. Compounds 4-15 and 4-16 refer to electron accepting materials represented by the following formulae, and Compounds 6-1, 6-2 and 6-3 refer to hole transport materials represented by the following formulae (collectively denoted as Formula 10).

Formula 10

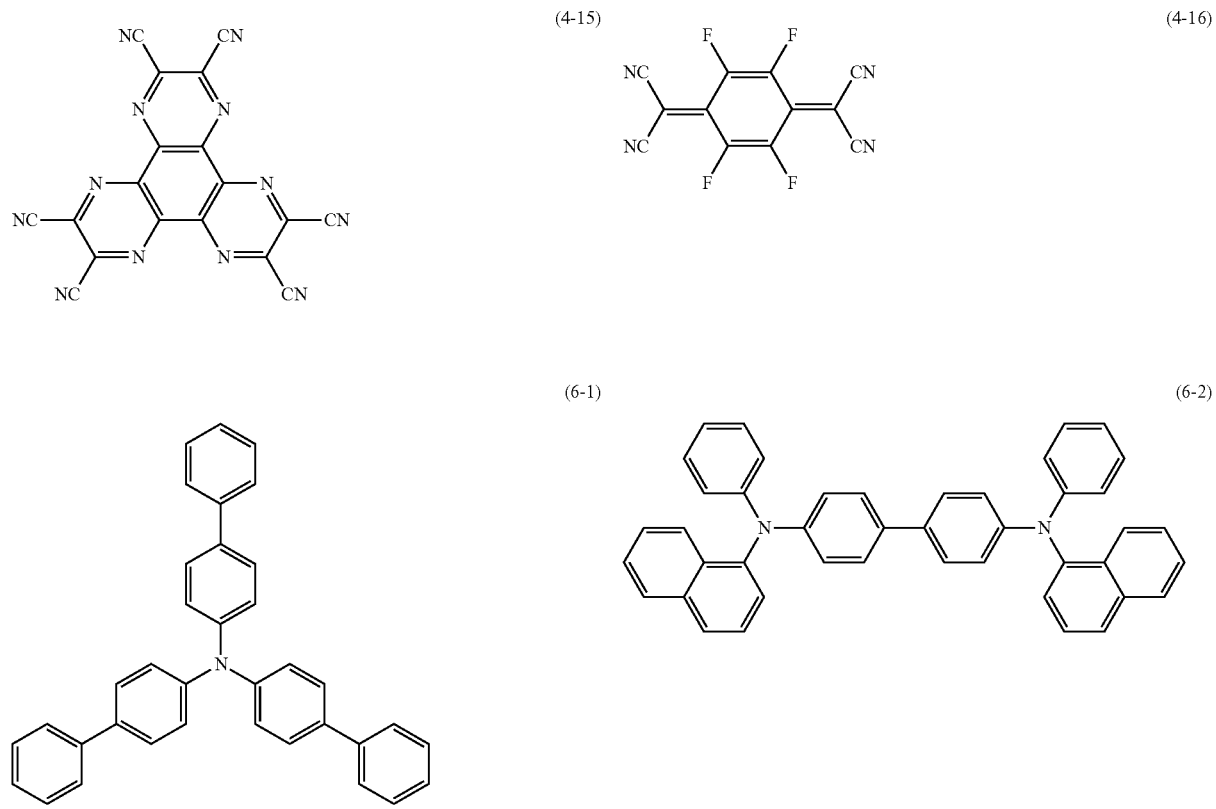

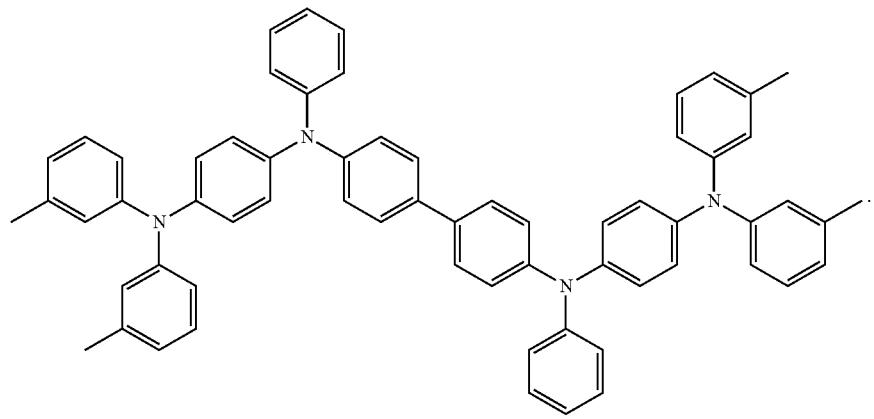

In addition, 9,10-di(2-naphthyl)anthracene (ADN, Compound 3-2) was used as the host material of the emission layer, and 2,5,8,11-tetra-t-butylperylene (TBP) was used as a dopant material (images of these compounds are illustrated below and collectively denoted as Formula 11). The dopant material was added in an amount ratio of about 3 wt % relative to the amount of the host material. An electron transport layer was formed using $Alq_3$, an electron injection layer was formed using LiF, and a second electrode was formed using aluminum (Al).

Formula 11

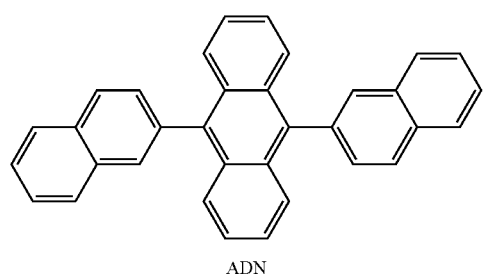

ADN

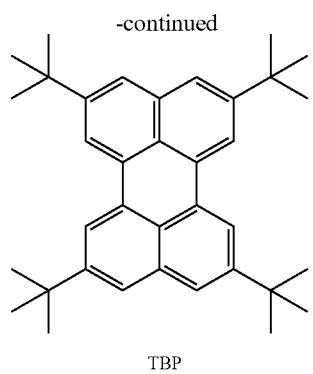

TBP

1-2-3. Evaluation Results

Then, driving voltage, emission efficiency, and emission life of the organic EL devices manufactured according to examples and comparative examples were evaluated. Evaluation results are shown in the following Table 1. The driving voltage and the emission efficiency in each example and comparative example were obtained by performing the measurements with current density of about 10 $mA/cm^2$. In addition, the emission efficiency and the emission life are represented as relative values when measured values in Comparative Example 1-1 are set to 1.

The measurements performed herein were conducted using a source meter of 2400 series of Keithley Instruments, Color brightness photometer CS-200 (Konica Minolta, measurement angle of 1°), and a PC program LabVIEW8.2 (National instruments, Japan) for measurement in a dark room.

TABLE 1

|  | Anode-side hole transport layer | Middle hole transport material layer | Emission layer-side hole transport layer | Driving voltage [V] | Emission life | Emission efficiency |
|---|---|---|---|---|---|---|
| Example 1-1 | Compound 4-15 | Compound 6-1 | Compound 1 | 6.3 | 1.0 | 1.09 |
| Example 1-2 | Compound 4-15 | Compound 6-2 | Compound 1 | 6.5 | 1.0 | 1.06 |
| Example 1-3 | Compound 4-16 | Compound 6-1 | Compound 1 | 6.4 | 1.0 | 1.08 |

TABLE 1-continued

| | Anode-side hole transport layer | Middle hole transport material layer | Emission layer-side hole transport layer | Driving voltage [V] | Emission life | Emission efficiency |
|---|---|---|---|---|---|---|
| Example 1-4 | Compound 4-16 | Compound 6-2 | Compound 1 | 6.6 | 1.0 | 1.06 |
| Comparative Example 1-1 | Compound 6-3 | Compound 6-1 | Compound 1 | 7.6 | 1 | 1 |
| Comparative Example 1-2 | Compound 4-15 | Compound 1 | Compound 6-1 | 6.5 | 0.9 | 0.8 |
| Comparative Example 1-3 | Compound 4-15 | Compound 6-1 | Compound 6-1 | 6.4 | 0.9 | 0.9 |
| Comparative Example 1-4 | Compound 4-16 | Compound 1 | Compound 6-1 | 6.6 | 0.9 | 0.8 |
| Comparative Example 1-5 | Compound 4-16 | Compound 6-1 | Compound 6-1 | 6.5 | 0.9 | 0.9 |

Referring to the results in Table 1, the organic EL devices according to Examples 1-1 to 1-4 exhibited improved emission efficiency, while maintaining substantially the same emission life, when compared to those of Comparative Examples 1-1 to 1-5. Without being bound by any particular theory, it is believed that the emission efficiency was increased in the organic EL devices according to Examples 1-1 to 1-4 by providing the anode-side hole transport layer, the middle hole transport material layer, and the emission layer-side hole transport layer between the first electrode and the emission layer.

For example, when comparing Examples 1-1 to 1-4 with Comparative Example 1-1, the properties of organic EL devices of Examples 1-1 to 1-4 were either similar or improved. In Comparative Example 1-1, the anode-side hole transport layer was formed using a hole transport material (Compound 6-3), instead of the electron accepting material (Compounds 4-15 and 4-16). Therefore, it is believed that the anode-side hole transport layer is preferably formed as a layer including mainly the electron accepting material.

In addition, when comparing Example 1-1 with Comparative Example 1-2, the properties of Example 1-1 were improved. When comparing Example 1-3 with Comparative Example 1-4, the properties of Example 1-3 were improved. In Comparative Example 1-2, the compounds included in the middle hole transport material layer and the emission layer-side hole transport layer were switched with respect to those used in these layers in Example 1-1. In Comparative Example 1-4, the compounds included in the middle hole transport material layer and the emission layer-side hole transport layer were switched with respect to those used in these layers in Example 1-3. Therefore, it is believed that the emission layer-side hole transport layer including the compound represented by Formula 1 is preferably positioned adjacent to the emission layer.

In addition, when comparing Examples 1-1 to 1-4 with Comparative Examples 1-3 and 1-5, the properties of Examples 1-1 to 1-4 were either similar or improved. In Comparative Examples 1-3 and 1-5, a known hole transport material (Compound 6-1) was used in the emission layer-side hole transport layer, instead of the compound represented by Formula 1. Therefore, it is believed that it is preferable to include the compound represented by Formula 1 in the emission layer-side hole transport layer.

As described above, according to example embodiments, when the anode-side hole transport layer including mainly the electron accepting material, the middle hole transport material layer, and the emission layer-side hole transport layer including the compound represented by Formula 1 are laminated between the first electrode (anode) and the emission layer, the emission efficiency of the organic EL device may be increased.

Without being bound by any particular theory, it is believed that by including the emission layer-side hole transport layer including the compound represented by Formula 1 into the hole transport layer of the organic EL device, the emission layer-side hole transport layer may protect the hole transport layer from electrons not consumed in the emission layer. In addition, the emission layer-side hole transport layer may prevent or reduce the diffusion of excited state energy (e.g., excitons) generated in the emission layer into the hole transport layer, thereby controlling the charge balance of the organic EL device. Also, it is believed that by including the emission layer-side hole transport layer including the compound represented by Formula 1, the emission layer-side hole transport layer may restrain or reduce the diffusion of the electron accepting material included in the anode-side hole transport layer provided near the first electrode (anode) into the emission layer.

While certain example embodiments of the inventive concept have been explained above with reference to the attached drawing, the present inventive concept is not limited thereto, but, on the contrary, is intended to cover various modifications and equivalent arrangements included within the spirit and scope of the appended claims and equivalents thereof.

2-1. Configuration of Organic EL Device Including Anode-Side Hole Transport Layer Including Anode-Side Hole Transport Material Doped with Electron Accepting Material Hereinafter, an organic EL device including an anode-side hole transport layer including an anode-side hole transport material doped with an electron accepting material will be explained with reference to the drawing.

An organic EL device including an anode-side hole transport layer including an anode-side hole transport material doped with an electron accepting material may have the same (or substantially the same) overall configuration as the organic EL device with the anode-side hole transport layer containing mainly the electron accepting material described above, including the same (or substantially the same) configuration of the substrate, the same (or substantially the same) configuration of the first electrode, the same (or substantially the same) configuration of the emission layer, the same (or substantially the same) configuration of the electron transport layer, the same (or substantially the same) configuration of the electron injection layer, and the same (or substantially the same) configuration of the second electrode. The organic EL device according to the present embodiment may be manufactured by the same (or substantially the same) method of manufacturing as described above, and may differ only in the configuration of the hole transport layer. Therefore, the configuration of the hole transport layer accordingly to the present embodiment will be explained hereinafter.

2-1-1. Configuration of Hole Transport Layer

The hole transport layer 130 according to the present embodiment may include a hole transport material having hole transporting capabilities. The hole transport layer 130 may be formed, for example, on the first electrode 120 to a layer thickness (the total layer thickness in a multi-layer structure) from about 10 nm to about 150 nm.

Here, the hole transport layer 130 of the organic EL device 100 according to an embodiment may be formed as a multi-layer by laminating (in a direction from the first electrode 120) an anode-side hole transport layer 131, a middle hole transport material layer 133, and an emission layer-side hole transport layer 135 one by one. The ratio of the thicknesses of the layers in the hole transport layer 130 is not specifically limited.

2-1-1-1. Configuration of Anode-Side Hole Transport Layer

The anode-side hole transport layer 131 may be a layer including an anode-side hole transport material doped with an electron accepting material. For example, the anode-side hole transport layer 131 may be formed on the first electrode 120.

The anode-side hole transport layer 131 may be doped with the electron accepting material and may improve hole injection property from the first electrode 120. Therefore, the anode-side hole transport layer 131 may be provided around (or near) the first electrode 120, for example, adjacent to the first electrode 120.

The anode-side hole transport material included in the anode-side hole transport layer 131 may be any suitable hole transport material. Non-limiting examples of the anode-side hole transport material included in the anode-side hole transport layer 131 may include 1,1-bis[(di-4-tolylamino)phenyl]cyclohexane (TAPC), a carbazole derivative (such as N-phenylcarbazole and/or polyvinylcarbazole), N,N'-bis(3-methylphenyl)-N,N'-diphenyl-[1,1-biphenyl]-4,4'-diamine (TPD), 4,4',4''-tris(N-carbazolyl)triphenylamine (TCTA), N,N'-di(1-naphthyl)-N,N'-diphenylbenzidine (NPB), etc.

The electron accepting material doped in the anode-side hole transport layer 131 may be any suitable electron accepting material. In some embodiments, the electron accepting material doped in the anode-side hole transport layer 131 may have a LUMO level from about −9.0 eV to about −4.0 eV, and in some embodiments may have the LUMO level from about −6.0 eV to about −4.0 eV.

Non-limiting examples of the electron accepting material having the LUMO level from about −9.0 eV to about −4.0 eV may include compounds represented by the following Formulae 4-1 to 4-14 (collectively denoted as Formula 4):

Formula 4

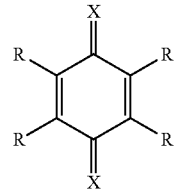
(4-1)

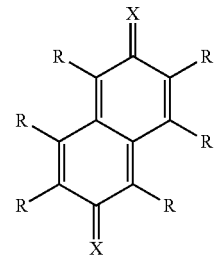
(4-2)

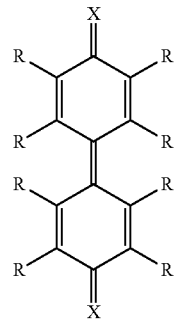
(4-3)

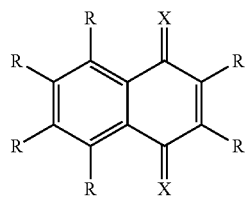
(4-4)

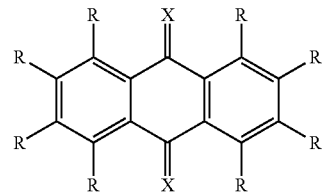
(4-5)

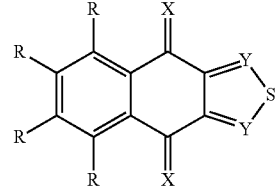
(4-6)

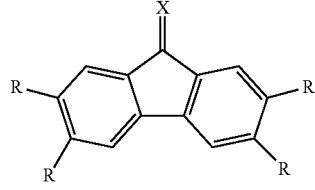
(4-7)

(4-8)
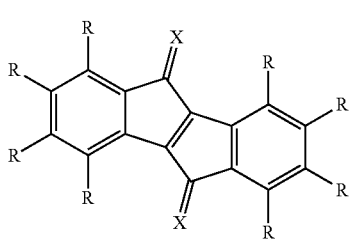

(4-9)
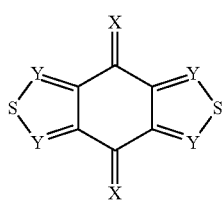

(4-10)
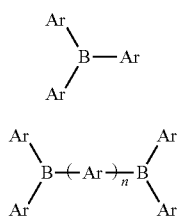

(4-11)
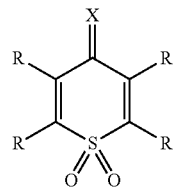

(4-12)
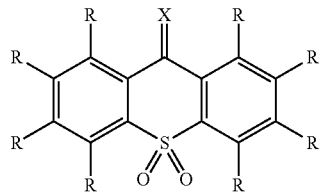

(4-13)
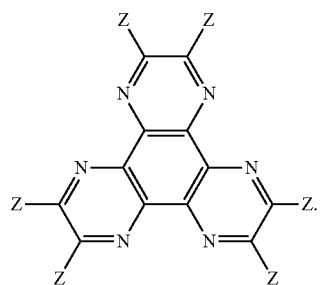

(4-14)
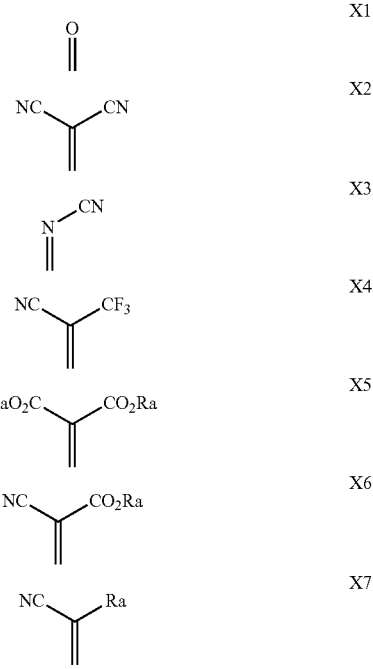

In the above Formulae 4-1 to 4-14, R may be selected from hydrogen, deuterium, a halogen atom, an alkyl fluoride group having 1 to 50 carbon atoms, a cyano group, an alkoxy group having 1 to 50 carbon atoms, an alkyl group having 1 to 50 carbon atoms, an aryl group having 6 to 50 carbon atoms for forming a ring, and a heteroaryl group having 5 to 50 carbon atoms for forming a ring. Ar may be selected from an aryl group substituted with an electron withdrawing group, an unsubstituted aryl group having 6 to 50 carbon atoms for forming a ring, and a substituted or unsubstituted heteroaryl group having 5 to 50 carbon atoms for forming a ring; Y may be a methine group (—CH=) or a nitrogen atom (—N=); Z may be a pseudohalogen (e.g., a pseudohalogen group) or may include sulfur (S) (e.g., Z may be a sulfur-containing group); n may be an integer of 10 or less; and X may be one of substituents represented by the following Formulae X1 to X7 (collectively denoted as Formula 5).

Formula 5

In Formulae X1 to X7, Ra may be selected from hydrogen, deuterium, a halogen atom, an alkyl fluoride group having 1 to 50 carbon atoms, a cyano group, an alkoxy group having 1 to 50 carbon atoms, an alkyl group having 1 to 50 carbon atoms, a substituted or unsubstituted aryl group having 6 to 50 carbon atoms for forming a ring, and a substituted or unsubstituted heteroaryl group having 5 to 50 carbon atoms for forming a ring.

Non-limiting examples of the substituted or unsubstituted aryl group having 6 to 50 carbon atoms for forming a ring, represented by, for example, R, Ar and/or Ra, may include a phenyl group, a 1-naphthyl group, a 2-naphthyl group, a 1-anthryl group, a 2-anthryl group, a 9-anthryl group, a 1-phenanthryl group, a 2-phenanthryl group, a 3-phenanthryl group, a 4-phenanthryl group, a 9-phenanthryl group, a 1-naphthacenyl group, a 2-naphthacenyl group, a 9-naphthacenyl group, a 1-pyrenyl group, a 2-pyrenyl group, a 4-pyrenyl group, a 2-biphenyl group, a 3-biphenyl group, a 4-biphenyl group, a p-terphenyl-4-yl group, a p-terphenyl-3-yl group, a p-terphenyl-2-yl group, an m-terphenyl-4-yl group, an m-terphenyl-3-yl group, an m-terphenyl-2-yl group, an o-tolyl group, an m-tolyl group, a p-tolyl group, a p-t-butylphenyl group, a p-(2-phenylpropyl)phenyl group, a 3-methyl-2-naphthyl group, a 4-methyl-1-naphthyl group, a 4-methyl-1-anthryl group, a 4'-methylbiphenyl group, a 4"-t-butyl-p-terphenyl-4-yl group, a fluoranthenyl group, a fluorenyl group, etc.

Non-limiting examples of the substituted or unsubstituted heteroaryl group having 5 to 50 carbon atoms for forming a ring, represented by, for example, R, Ar and/or Ra, may include a 1-pyrrolyl group, a 2-pyrrolyl group, a 3-pyrrolyl group, a pyrazinyl group, a 2-pyridinyl group, a 3-pyridinyl group, a 4-pyridinyl group, a 1-indolyl group, a 2-indolyl group, a 3-indolyl group, a 4-indolyl group, a 5-indolyl group, a 6-indolyl group, a 7-indolyl group, a 1-isoindolyl group, a 2-isoindolyl group, a 3-isoindolyl group, a 4-isoindolyl group, a 5-isoindolyl group, a 6-isoindolyl group, a 7-isoindolyl group, a 2-furyl group, a 3-furyl group, a 2-benzofuranyl group, a 3-benzofuranyl group, a 4-benzofuranyl group, a 5-benzofuranyl group, a 6-benzofuranyl group, a 7-benzofuranyl group, a 1-isobenzofuranyl group, a 3-isobenzofuranyl group, a 4-isobenzofuranyl group, a 5-isobenzofuranyl group, a 6-isobenzofuranyl group, a 7-isobenzofuranyl group, a quinolyl group, a 3-quinolyl group, a 4-quinolyl group, a 5-quinolyl group, a 6-quinolyl group, a 7-quinolyl group, an 8-quinolyl group, a 1-isoquinolyl group, a 3-isoquinolyl group, a 4-isoquinolyl group, a 5-isoquinolyl group, a 6-isoquinolyl group, a 7-isoquinolyl group, an 8-isoquinolyl group, a 2-quinoxalinyl group, a 5-quinoxalinyl group, a 6-quinoxalinyl group, a 1-carbazolyl group, a 2-carbazolyl group, a 3-carbazolyl group, a 4-carbazolyl group, a 9-carbazolyl group, a 1-phenanthridinyl group, a 2-phenanthridinyl group, a 3-phenanthridinyl group, a 4-phenanthridinyl group, a 6-phenanthridinyl group, a 7-phenanthridinyl group, an 8-phenanthridinyl group, a 9-phenanthridinyl group, a 10-phenanthridinyl group, a 1-acridinyl group, a 2-acridinyl group, a 3-acridinyl group, a 4-acridinyl group, a 9-acridinyl group, a 1,7-phenanthroline-2-yl group, a 1,7-phenanthroline-3-yl group, a 1,7-phenanthroline-4-yl group, a 1,7-phenanthroline-5-yl group, a 1,7-phenanthroline-6-yl group, a 1,7-phenanthroline-8-yl group, a 1,7-phenanthroline-9-yl group, a 1,7-phenanthroline-10-yl group, a 1,8-phenanthroline-2-yl group, a 1,8-phenanthroline-3-yl group, a 1,8-phenanthroline-4-yl group, a 1,8-phenanthroline-5-yl group, a 1,8-phenanthroline-6-yl group, a 1,8-phenanthroline-7-yl group, a 1,8-phenanthroline-9-yl group, a 1,8-phenanthroline-10-yl group, a 1,9-phenanthroline-2-yl group, a 1,9-phenanthroline-3-yl group, a 1,9-phenanthroline-4-yl group, a 1,9-phenanthroline-5-yl group, a 1,9-phenanthroline-6-yl group, a 1,9-phenanthroline-7-yl group, a 1,9-phenanthroline-8-yl group, a 1,9-phenanthroline-10-yl group, a 1,10-phenanthroline-2-yl group, a 1,10-phenanthroline-3-yl group, a 1,10-phenanthroline-4-yl group, a 1,10-phenanthroline-5-yl group, a 2,9-phenanthroline-1-yl group, a 2,9-phenanthroline-3-yl group, a 2,9-phenanthroline-4-yl group, a 2,9-phenanthroline-5-yl group, a 2,9-phenanthroline-6-yl group, a 2,9-phenanthroline-7-yl group, a 2,9-phenanthroline-8-yl group, a 2,9-phenanthroline-10-yl group, a 2,8-phenanthroline-1-yl group, a 2,8-phenanthroline-3-yl group, a 2,8-phenanthroline-4-yl group, a 2,8-phenanthroline-5-yl group, a 2,8-phenanthroline-6-yl group, a 2,8-phenanthroline-7-yl group, a 2,8-phenanthroline-9-yl group, a 2,8-phenanthroline-10-yl group, a 2,7-phenanthroline-1-yl group, a 2,7-phenanthroline-3-yl group, a 2,7-phenanthroline-4-yl group, a 2,7-phenanthroline-5-yl group, a 2,7-phenanthroline-6-yl group, a 2,7-phenanthroline-8-yl group, a 2,7-phenanthroline-9-yl group, a 2,7-phenanthroline-10-yl group, a 1-phenazinyl group, a 2-phenazinyl group, a 1-phenothiazinyl group, a 2-phenothiazinyl group, a 3-phenothiazinyl group, a 4-phenothiazinyl group, a 10-phenothiazinyl group, a 1-phenoxaziny group, a 2-phenoxazinyl group, a 3-phenoxazinyl group, a 4-phenoxazinyl group, a 10-phenoxazinyl group, a 2-oxazolyl group, a 4-oxazolyl group, a 5-oxazolyl group, a 2-oxadiazolyl group, a 5-oxadiazolyl group, a 3-furazanyl group, a 2-thienyl group, a 3-thienyl group, a 2-methylpyrrole-1-yl group, a 2-methylpyrrole-3-yl group, a 2-methylpyrrole-4-yl group, a 2-methylpyrrole-5-yl group, a 3-methylpyrrole-1-yl group, a 3-methylpyrrole-2-yl group, a 3-methylpyrrole-4-yl group, a 3-methylpyrrole-5-yl group, a 2-t-butylpyrrole-4-yl group, a 3-(2-phenylpropyl)pyrrole-1-yl group, a 2-methyl-1-indolyl group, a 4-methyl-1-indolyl group, a 2-methyl-3-indolyl group, a 4-methyl-3-indolyl group, a 2-t-butyl-1-indolyl group, a 4-t-butyl-1-indolyl group, a 2-t-butyl-3-indolyl group, a 4-t-butyl-3-indolyl group, etc.

Non-limiting examples of the substituted or unsubstituted alkyl fluoride group having 1 to 50 carbon atoms, represented by, for example, R and/or Ra, may include a perfluoroalkyl group (such as a trifluoromethyl group, a pentafluoroethyl group, a heptafluoropropyl group, and/or a heptadecafluorooctane group), a monofluoromethyl group, a difluoromethyl group, a trifluoroethyl group, a tetrafluoropropyl group, an octafluoropentyl group, etc.

Non-limiting examples of the substituted or unsubstituted alkyl group having 1 to 50 carbon atoms, represented by, for example, R and/or Ra, may include a methyl group, an ethyl group, a propyl group, an isopropyl group, an n-butyl group, an s-butyl group, an isobutyl group, a t-butyl group, an n-pentyl group, an n-hexyl group, an n-heptyl group, an n-octyl group, a hydroxymethyl group, a 1-hydroxyethyl group, a 2-hydroxyethyl group, a 2-hydroxyisobutyl group, a 1,2-dihydroxyethyl group, a 1,3-dihydroxyisopropyl group, a 2,3-dihydroxy-t-butyl group, a 1,2,3-trihydroxypropyl group, chloromethyl group, a 1-chloroethyl group, a 2-chloroethyl group, a 2-chloroisobutyl group, a 1,2-dichloroethyl group, a 1,3-dichloroisopropyl group, a 2,3-dichloro-t-butyl group, a 1,2,3-trichloropropyl group, a bromomethyl group, a 1-bromoethyl group, a 2-bromoethyl group, a 2-bromoisobutyl group, a 1,2-dibromoethyl group, a 1,3-dibromoisopropyl group, a 2,3-dibromo-t-butyl group, a 1,2,3-tribromopropyl group, an iodomethyl group, a 1-iodoethyl group, a 2-iodoethyl group, a 2-iodoisobutyl group, a 1,2-diiodoethyl group, a 1,3-diiodoisopropyl group, a 2,3-diiodo-t-butyl group, a 1,2,3-triiodopropyl group, an aminomethyl group, a 1-aminoethyl group, a 2-aminoethyl group, a 2-aminoisobutyl group, a 1,2-diaminoethyl group, a 1,3-diaminoisopropyl group, a 2,3-diamino-t-butyl group, a 1,2,3-triaminopropyl group, a cyanomethyl group, a 1-cyanoethyl group, a 2-cyanoethyl group, a 2-cyanoisobutyl group, a 1,2-dicyanoethyl group, a 1,3-dicyanoisopropyl group, a 2,3-dicyano-t-butyl group, a 1,2,3-tricyanopropyl group, a nitromethyl group, a 1-nitroethyl group, a 2-nitroethyl group, a 2-nitroisobutyl group, a 1,2-dinitroethyl group, a 1,3-dinitroisopropyl group, a 2,3-dinitro-t-butyl group, a 1,2,3-trinitropropyl group, a cyclopropyl group, a cyclobutyl group, a cyclopentyl group, a cyclohexyl group, a 4-methylcyclohexyl group, a 1-adamantyl group, a 2-adamantyl group, a 1-norbornyl group, a 2-norbornyl group, etc.

The substituted or unsubstituted alkoxy group having 1 to 50 carbon atoms, represented by, for example, R and/or Ra, may be a group represented by —OY. Non-limiting examples of Y may include a methyl group, an ethyl group, a propyl group, an isopropyl group, an n-butyl group, an s-butyl group, an isobutyl group, a t-butyl group, an n-pentyl group, an n-hexyl group, an n-heptyl group, an n-octyl group, a hydroxymethyl group, a 1-hydroxyethyl group, a 2-hydroxyethyl group, a 2-hydroxyisobutyl group, a 1,2-dihydroxyethyl group, a 1,3-dihydroxyisopropyl group, a 2,3-dihydroxy-t-butyl group, a 1,2,3-trihydroxypropyl group, chloromethyl group, a 1-chloroethyl group, a 2-chloroethyl group, a 2-chloroisobutyl group, a 1,2-dichloroethyl group, a 1,3-dichloroisopropyl group, a 2,3-dichloro-t-butyl group, a 1,2,3-trichloropropyl group, a bromomethyl group, a 1-bromoethyl group, a 2-bromoethyl group, a 2-bromoisobutyl group, a 1,2-dibromoethyl group, a 1,3-dibromoisopropyl group, a 2,3-dibromo-t-butyl group, a 1,2,3-tribromopropyl group, an iodomethyl group, a 1-iodoethyl group, a 2-iodoethyl group, a 2-iodoisobutyl group, a 1,2-diiodoethyl group, a 1,3-diiodoisopropyl group, a 2,3-diiodo-t-butyl group, a 1,2,3-triiodopropyl group, an aminomethyl group, a 1-aminoethyl group, a 2-aminoethyl group, a 2-aminoisobutyl group, a 1,2-diaminoethyl group, a 1,3-diaminoisopropyl group, a 2,3-diamino-t-butyl group, a 1,2,3-triaminopropyl group, a cyanomethyl group, a 1-cyanoethyl group, a 2-cyanoethyl group, a 2-cyanoisobutyl group, a 1,2-dicyanoethyl group, a 1,3-dicyanoisopropyl group, a 2,3-dicyano-t-butyl group, a 1,2,3-tricyanopropyl group, a nitromethyl group, a 1-nitroethyl group, a 2-nitroethyl group, a 2-nitroisobutyl group, a 1,2-dinitroethyl group, a 1,3-dinitroisopropyl group, a 2,3-dinitro-t-butyl group, a 1,2,3-trinitropropyl group, etc.

Non-limiting examples of the halogen atom, represented by, for example, R and/or Ra, may include fluorine (F), chlorine (Cl), bromine (Br), iodine (I), etc.

In some embodiments, the electron accepting material may include the following Compounds 4-15 and 4-16 (collectively denoted as Formula 6). The LUMO level of Compound 4-15 may be about −4.40 eV, and the LUMO level of Compound 4-16 may be about −5.20 eV. However, the electron accepting material used in the organic EL device according to an embodiment is not limited to the following Compounds 4-15 and 4-15.

Formula 6

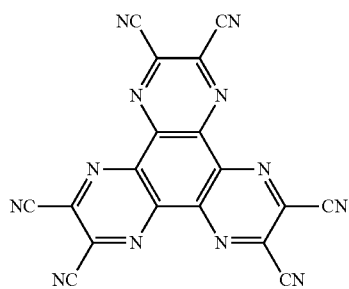
(4-15)

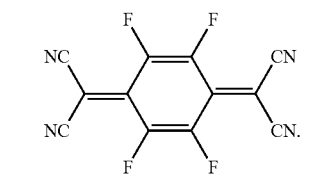
(4-16)

The amount doped of the electron accepting material (e.g., the doping amount of the electron accepting material) is not specifically limited, so long as the amount may be suitably doped into the anode-side hole transport layer 131. For example, the amount doped of the electron accepting material may be from about 0.1 mass % to about 50 mass %, and in some embodiments may be from about 0.5 mass % to about 5 mass %, relative to the total mass of the anode-side hole transport material included in the anode-side hole transport layer 131.

2-1-1-2. Configuration of Middle Hole Transport Material Layer

The middle hole transport material layer 133 may include a middle hole transport material. The middle hole transport material layer 133 may be formed, for example, on the anode-side hole transport layer 131.

The middle hole transport material included in the middle hole transport material layer 133 may be any suitable hole transport material. Non-limiting examples of the middle hole transport material may include the hole transport materials described above in connection with the anode-side hole transport material.

In some embodiments, the middle hole transport material may be a compound represented by the following Formula 2:

Formula 2

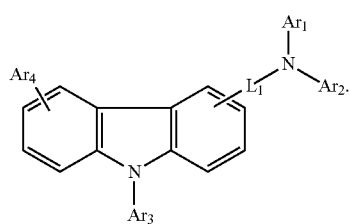

In Formula 2, $Ar_1$—$Ar_3$ may be each independently a substituted or unsubstituted aryl group having 6 to 50 carbon atoms for forming a ring, or a substituted or unsubstituted heteroaryl group having 5 to 50 carbon atoms for forming a ring. $Ar_4$ may be selected from hydrogen, deuterium, a halogen atom, a substituted or unsubstituted aryl group having 6 to 50 carbon atoms for forming a ring, a substituted or unsubstituted heteroaryl group having 5 to 50 carbon atoms for forming a ring, and a substituted or unsubstituted alkyl group having 1 to 50 carbon atoms. $L_1$ may be selected from a direct linkage, a substituted or unsubstituted arylene group having 6 to 18 carbon atoms for forming a ring, and a substituted or unsubstituted heteroarylene group having 5 to 15 carbon atoms for forming a ring. Here, the expression "direct linkage" may refer to a bond such as a single bond.

Non-limiting examples of $Ar_1$-$Ar_3$ may include a phenyl group, a biphenyl group, a terphenyl group, a naphthyl group, an anthryl group, a phenanthryl group, a fluorenyl group, an indenyl group, a pyrenyl group, a fluoranthenyl group, a triphenylenyl group, a pyridyl group, a furanyl group, a pyranyl group, a thienyl group, a quinolyl group, an isoquinolyl group, a benzofuranyl group, a benzothienyl group, an indolyl group, a carbazolyl group, a benzoxazolyl group, a benzothiazolyl group, a quinoxalyl group, a benzoimidazolyl group, a pyrazolyl group, a dibenzofuranyl group, a dibenzothienyl group, etc. In some embodiments, $Ar_1$—$Ar_3$ may each independently include the phenyl group, the biphenyl group, the terphenyl group, the fluorenyl group, the carbazolyl group, the dibenzofuranyl group, etc.

Non-limiting examples of $Ar_4$ may include a phenyl group, a biphenyl group, a terphenyl group, a naphthyl group, an anthryl group, a phenanthryl group, a fluorenyl group, an indenyl group, a pyrenyl group, a fluoranthenyl group, a triphenylenyl group, a pyridyl group, a furanyl group, a pyranyl group, a thienyl group, a quinolyl group, an isoquinolyl group, a benzofuranyl group, a benzothienyl group, an indolyl group, a carbazolyl group, a benzoxazolyl group, a benzothiazolyl group, a quinoxalyl group, a benzoimidazolyl group, a pyrazolyl group, a dibenzofuranyl group, a dibenzothienyl group, a methyl group, an ethyl group, a propyl group, an isopropyl group, an n-butyl group, etc. In some embodiments, $Ar_4$ may include the phenyl group, the biphenyl group, the terphenyl group, the fluorenyl group, the carbazolyl group, the dibenzofuranyl group, etc.

Non-limiting examples of $L_1$, other than the direct linkage, may include a phenylene group, a biphenylene group, a terphenylene group, a naphthylene group, an anthrylene group, a phenanthrylene group, a fluorenylene group, an indenylene group, a pyrenylene group, a fluoranthenylene group, a triphenylenylene group, a pyridylene group, a furanylene group, a pyranylene group, a thienylene group, a quinolylene group, an isoquinolylene group, a benzofuranylene group, a benzothienylene group, an indolylene group, a carbazolylene group, a benzoxazolylene group, a benzothiazolylene group, a quinoxalylene group, a benzoimidazolylene group, a pyrazolylene group, a dibenzofuranylene group, a dibenzothienylene group, etc. In some embodiments, $L_1$ may include the direct linkage, the phenylene group, the biphenylene group, the terphenylene group, the fluorenylene group, the carbazolylene group, and/or the dibenzofuranylene group.

Non-limiting examples of the compound represented by Formula 2 may include the following Compounds 2-1 to 2-16 (collectively denoted as Formula 7). However, the compound represented by Formula 2 is not limited to Compounds 2-1 to 2-16.

Formula 7

(2-1)

(2-2)

(2-3)

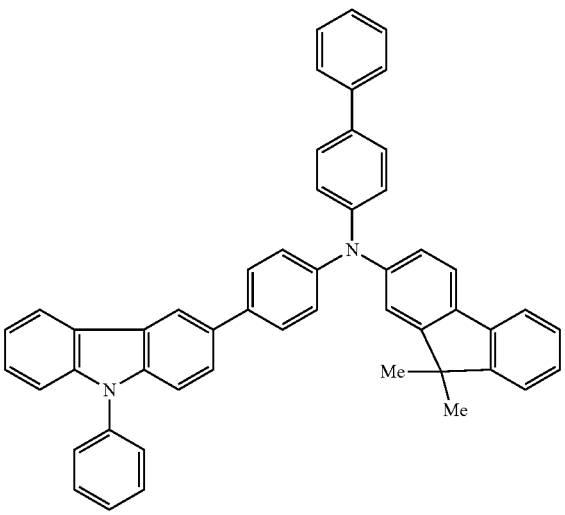

(2-4)

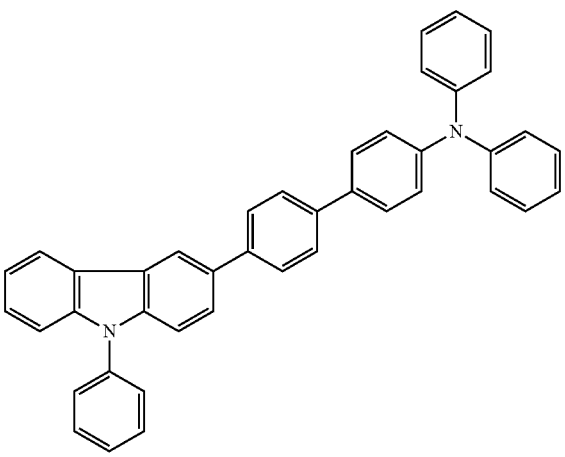

(2-5)

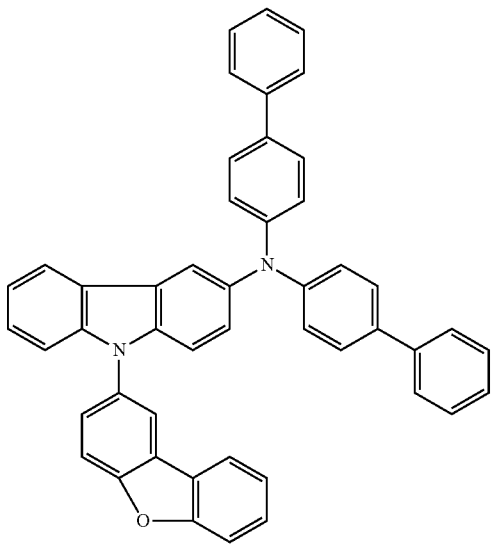

(2-6)
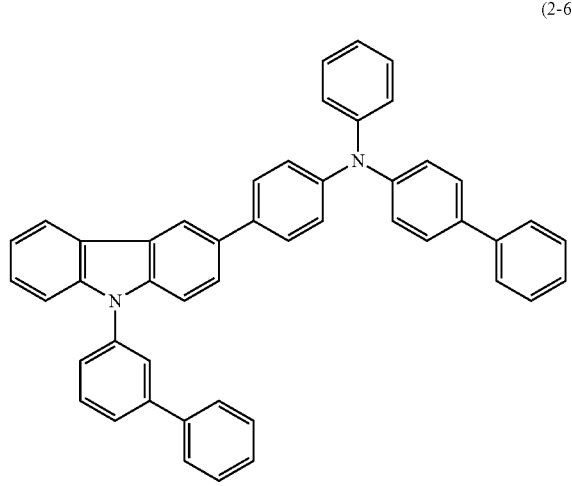
(2-7)
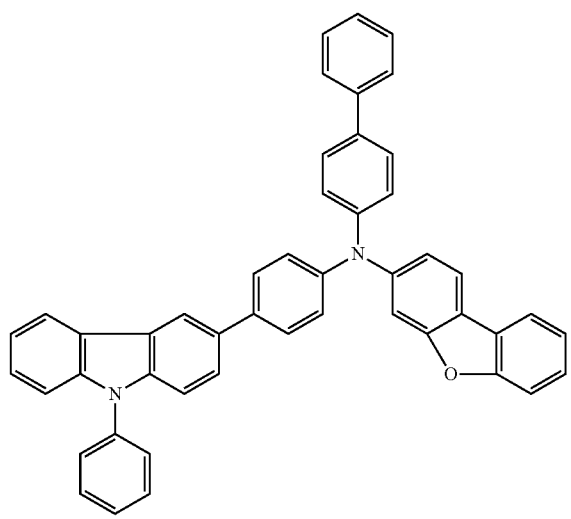
(2-8)
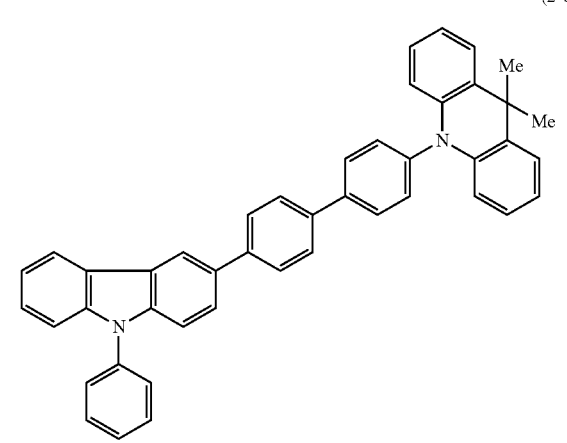
(2-9)
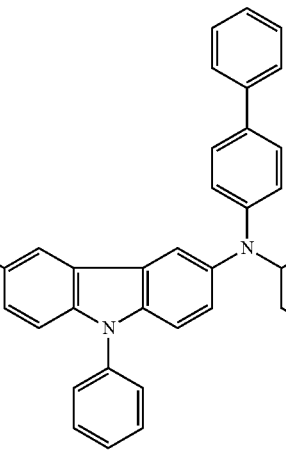
(2-10)
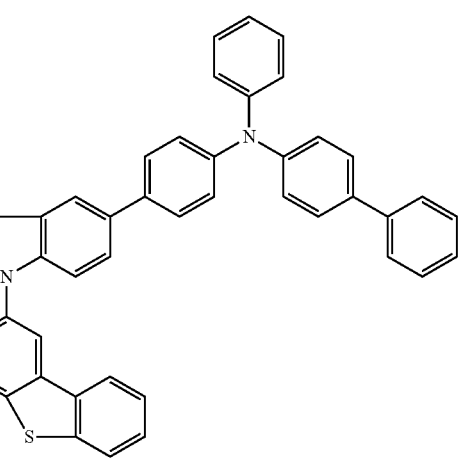
(2-11)
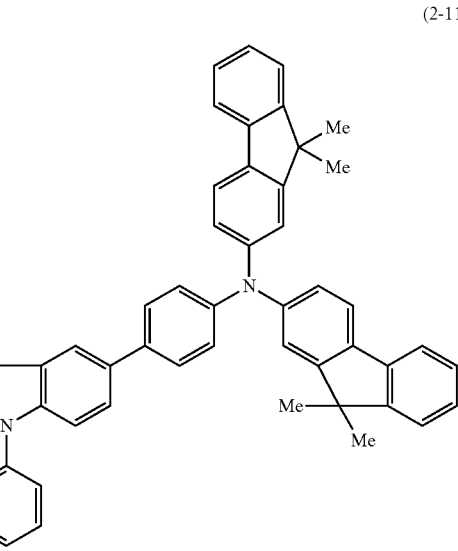

-continued (2-12)
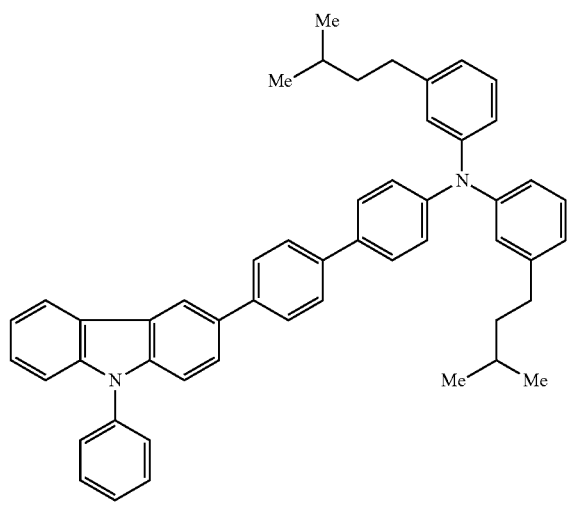

(2-13)
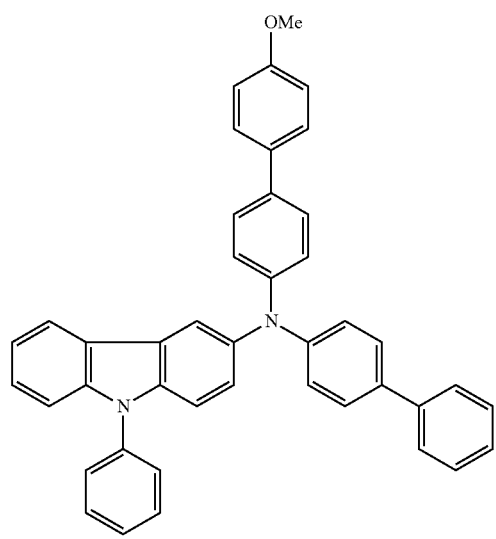

(2-14)
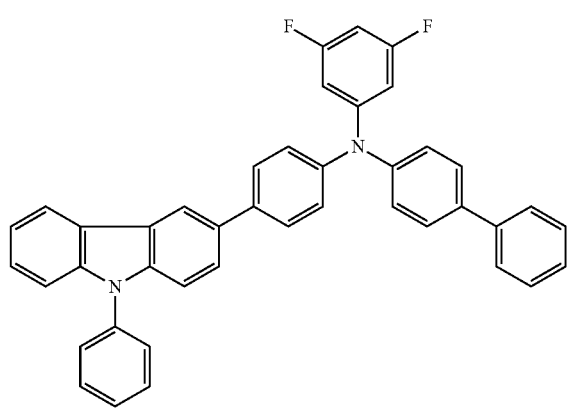

(2-15)
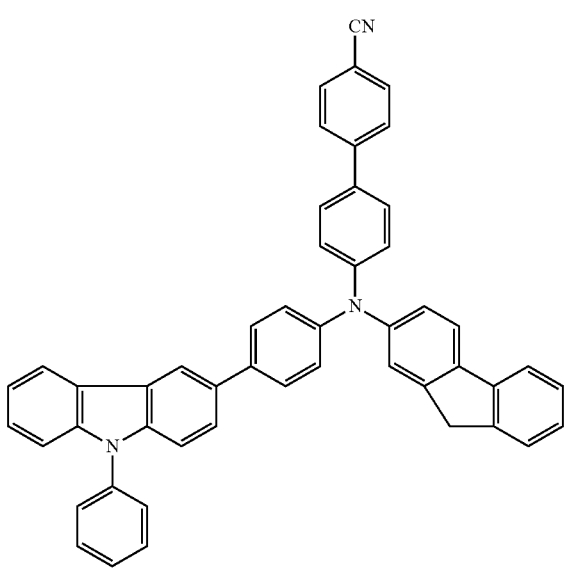

(2-16)
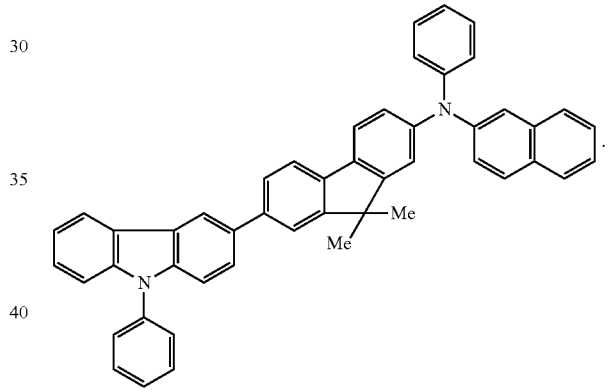

The middle hole transport material layer 133 may include the compound represented by Formula 2 as the middle hole transport material, and thus may improve the hole transport property and emission life of the organic EL device 100.

In some embodiments, the compound represented by Formula 2 may be included in the anode-side hole transport layer 131 as the anode-side hole transport material. In embodiments where the anode-side hole transport layer 131 includes the compound represented by Formula 2, hole transport property may be further improved, and the emission life of the organic EL device 100 may be increased.

2-1-1-3. Configuration of Emission Layer-Side Hole Transport Layer

The emission layer-side hole transport layer 135 may include a compound represented by the following Formula 1. The emission layer-side hole transport layer 135 may be formed, for example, on the middle hole transport material layer 133, and may be adjacent to the emission layer 140.

Formula 1

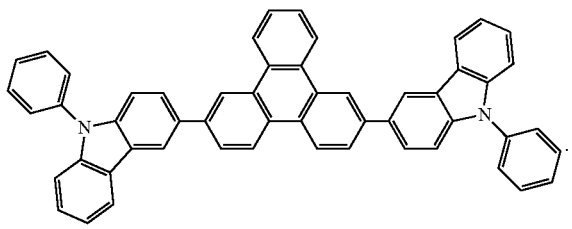

The emission layer-side hole transport layer 135 may include the compound represented by the above Formula 1 as the emission layer-side hole transport material and may protect the hole transport layer 130 from electrons not consumed in the emission layer 140. In addition, when the emission layer-side hole transport layer 135 includes the compound represented by Formula 1, the diffusion of the energy in an excited state (e.g., excitons) generated in the emission layer 140 into the hole transport layer 130 may be prevented or reduced. According to this configuration, the emission layer-side hole transport layer 135 may improve the current flow durability of the hole transport layer 130.

The emission layer-side hole transport layer 135 may be formed around (e.g., near) the emission layer 140, and in some embodiments may be adjacent to the emission layer 140, to effectively (or suitably) prevent or reduce the diffusion of electrons or energy (e.g., excitons) from the emission layer 140.

In addition, when the emission layer-side hole transport layer 135 includes the compound represented by Formula 1, the charge balance of the organic EL device 100 may be controlled, and the diffusion of the electron accepting material doped in the anode-side hole transport layer 131 into the emission layer 140 may be restrained or reduced. Accordingly, the emission layer-side hole transport layer 135 may improve the charge transport property of the hole transport layer 130.

According to embodiments of the present disclosure, when the emission layer-side hole transport layer 135 includes the compound represented by Formula 1, the charge transport property and current flow durability of the hole transport layer 130 may be improved, and the emission life of the organic EL device 100 may be improved.

2-2. Examples

Hereinafter, the organic EL devices according to example embodiments will be explained in more detail with reference to examples and comparative examples. However, the following examples are only for illustration, and the organic EL device according to example embodiments is not limited thereto.

2-2-1. Synthesis of Compound Represented by Formula 1

First, a synthesis method of a compound represented by Formula 1 will be explained. However, the synthesis method of the compound represented by Formula 1 is not limited thereto.

A compound represented by Formula 1 was synthesized according to the following Reaction 1 (denoted as Formula 9).

(Reaction 1)

Formula 9

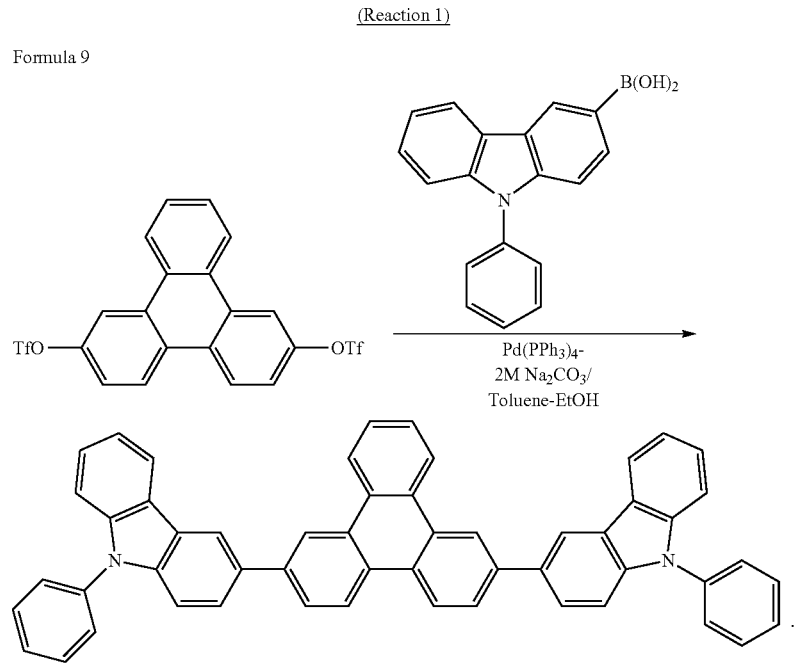

To a toluene suspension (200 ml) of 2,7-bis(trifluoromethanesulfonyloxy)triphenylene (9.46 g, 18.0 mmol), and 9-phenylcarbazol-3-boronic acid (10.9 g, 37.9 mmol), 2 M sodium carbonate ($Na_2CO_3$) aqueous solution (50 ml) and ethanol (EtOH) (10 ml) were added and degassed. Under an argon atmosphere, tetrakis(triphenylphosphine)palladium (0) ($Pd(PPh_3)_4$) (2.09 g, 1.80 mmol) was added to the degassed mixture, followed by stirring and refluxing the resulting mixture for about 8 hours. After the reaction was washed with each of water and toluene, the obtained precipitate was dissolved in a hot pyridine solvent and treated with activated carbon. The resulting pyridine solution was crystallized, and a target material of 2,7-bis(carbazol-3-yl)triphenylene (6.90 g, 53%) was obtained as a lemon yellow powder. The resulting product was identified by Fast atom bombardment mass spectrometry (FAB-MS) by confirming the ion peak (mass number 710) of the molecule.

2-2-2. Manufacture of Organic EL Device Including Anode-Side Hole Transport Layer Including Anode-Side Hole Transport Material Doped with Electron Accepting Material An organic EL device according to an embodiment was manufactured by the following manufacturing method.

First, with respect to an ITO-glass substrate patterned and washed in advance, surface treatment using UV-Ozone ($O_3$) was conducted. In addition, the layer thickness of an ITO layer (here, first electrode) on a glass substrate was about 150 nm. After ozone treatment, the substrate washed was inserted into an evaporator for forming an organic layer, and an anode-side hole transport layer, a middle hole transport material layer, an emission layer-side hole transport layer, an emission layer and an electron transport layer were evaporated one by one at a vacuum degree of about $10^{-4}$ to about $10^{-5}$ Pa. The layer thickness of each of the anode-side hole transport layer, the middle hole transport material layer and the emission layer-side hole transport layer was about 10 nm. Each thickness of the emission layer and the electron transport layer was about 25 nm, respectively. Then, the substrate was moved into an evaporator for forming a metal layer, and the electron injection layer and the second electrode were evaporated at a vacuum degree of about $10^{-4}$ to about $10^{-5}$ Pa. The layer thickness of the electron injection layer was about 1 nm, and the layer thickness of the second electrode was about 100 nm.

Here, the anode-side hole transport layer, the middle hole transport material layer and the emission layer-side hole transport layer together formed a hole transport layer with a multi-layer structure. The anode-side hole transport layer, the middle hole transport material layer and the emission layer-side hole transport layer were manufactured in examples and comparative examples using the materials shown in the following Table 2.

In Table 2, the expression "Compound 2-1, Compound 4-15" may refer to the anode-side hole transport material (Compound 2-1) doped with the electron accepting material (Compound 4-15). Here, the amount doped of the electron accepting material was about 3 mass % relative to the mass of the anode-side hole transport material.

In Table 2, Compound 1 refers to 2,7-bis(carbazol-3-yl)triphenylene, the synthesis method of which was explained above. Compounds 4-15 and 4-16 refer to electron accepting materials represented by the following formulae, and Compounds 6-1, 6-2 and 6-3 refer to hole transport materials represented by the following formulae (collectively denoted as Formula 10).

Formula 10

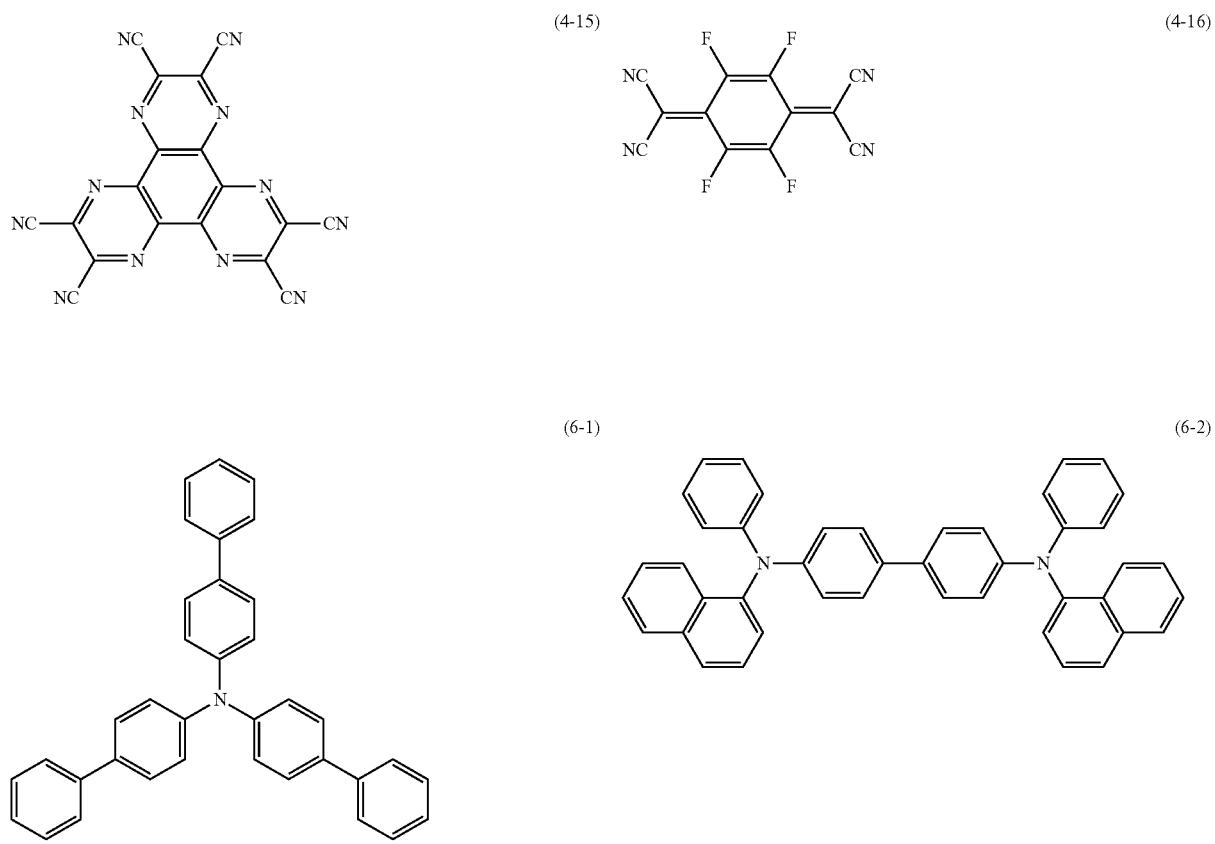

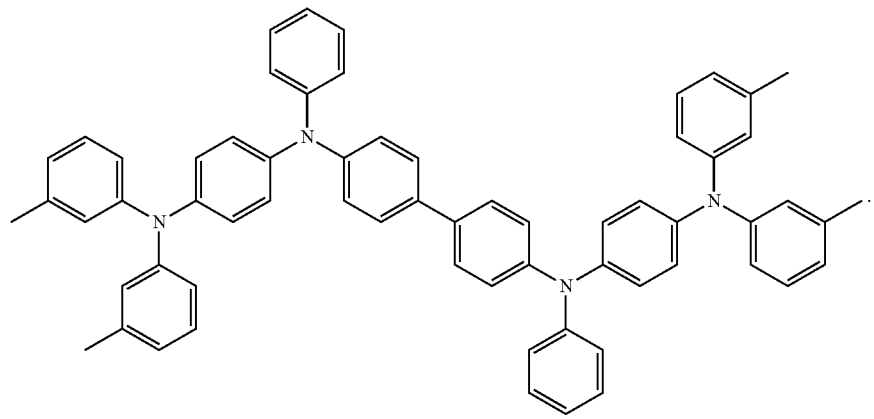

(6-3)

In addition, 9,10-di(2-naphthyl)anthracene (ADN, Compound 3-2) was used as the host material of the emission layer, and 2,5,8,11-tetra-t-butylperylene (TBP) was used as a dopant material (images of these compounds are illustrated below and collectively denoted as Formula 11). The dopant material was added in an amount ratio of about 3 wt % relative to the amount of the host material. An electron transport layer was formed using $Alq_3$, an electron injection layer was formed using LiF, and a second electrode was formed using aluminum (Al).

Formula 11

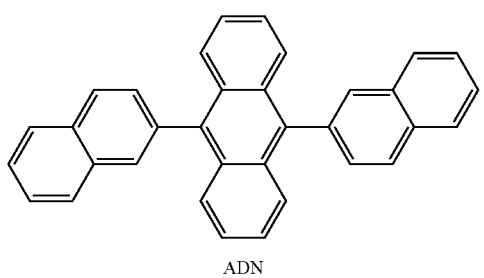

ADN

-continued

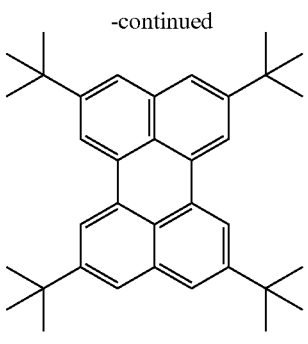

TBP

2-2-3. Evaluation Results

Then, driving voltage, emission efficiency, and emission life (e.g., half life) of the organic EL devices manufactured according to examples and comparative examples were evaluated. The evaluation results are shown in the following Table 2. The driving voltage and the emission efficiency in each example and comparative example were obtained by performing the measurements with current density of about 10 $mA/cm^2$. In addition, the emission efficiency and the emission life are represented by relative values when measured values in Comparative Example 2-1 were set to 1.

The measurements performed herein were conducted using a source meter of 2400 series of Keithley Instruments, Color brightness photometer CS-200 (Konica Minolta, measurement angle of 1°), and a PC program LabVIEW8.2 (National instruments, Japan) for measurement in a dark room.

TABLE 2

| | Anode-side hole transport layer | Middle hole transport material layer | Emission layer-side hole transport layer | Driving voltage [V] | Emission life | Emission efficiency |
|---|---|---|---|---|---|---|
| Example 2-1 | Compound 6-3, Compound 4-15 | Compound 2-1 | Compound 1 | 6.3 | 1.4 | 1.09 |
| Example 2-2 | Compound 6-1, Compound 4-15 | Compound 2-1 | Compound 1 | 6.0 | 1.4 | 1.07 |

TABLE 2-continued

| | Anode-side hole transport layer | Middle hole transport material layer | Emission layer-side hole transport layer | Driving voltage [V] | Emission life | Emission efficiency |
|---|---|---|---|---|---|---|
| Example 2-3 | Compound 2-1, Compound 4-15 | Compound 2-1 | Compound 1 | 6.1 | 1.4 | 1.08 |
| Example 2-4 | Compound 2-1, Compound 4-15 | Compound 6-2 | Compound 1 | 6.1 | 1.4 | 1.06 |
| Example 2-5 | Compound 6-3, Compound 4-16 | Compound 2-1 | Compound 1 | 6.4 | 1.4 | 1.08 |
| Example 2-6 | Compound 6-1, Compound 4-16 | Compound 2-1 | Compound 1 | 6.1 | 1.4 | 1.07 |
| Example 2-7 | Compound 2-1, Compound 4-16 | Compound 2-1 | Compound 1 | 6.2 | 1.4 | 1.07 |
| Example 2-8 | Compound 2-1, Compound 4-16 | Compound 6-2 | Compound 1 | 6.2 | 1.4 | 1.06 |
| Comparative Example 2-1 | Compound 6-3 | Compound 2-1 | Compound 1 | 7.6 | 1 | 1 |
| Comparative Example 2-2 | Compound 6-3, Compound 4-15 | Compound 1 | Compound 2-1 | 6.5 | 0.9 | 0.8 |
| Comparative Example 2-3 | Compound 6-3, Compound 4-15 | Compound 2-1 | Compound 2-1 | 6.4 | 0.9 | 0.9 |
| Comparative Example 2-4 | Compound 6-3, Compound 4-16 | Compound 1 | Compound 2-1 | 6.6 | 0.9 | 0.8 |
| Comparative Example 2-5 | Compound 6-3, Compound 4-16 | Compound 2-1 | Compound 2-1 | 6.5 | 0.9 | 0.9 |

Referring to the results in Table 2, the organic EL devices according to Examples 2-1 to 2-8 exhibited improved emission life and emission efficiency, when compared to those of Comparative Examples 2-1 to 2-5. Without being bound by any particular theory, it is believed that the emission life of the organic EL devices according to Examples 2-1 to 2-8 was improved by providing the anode-side hole transport layer, the middle hole transport material layer and the emission layer-side hole transport layer between the first electrode and the emission layer.

For example, when comparing Examples 2-1 to 2-8 with Comparative Example 2-1, the properties of Examples 2-1 to 2-8 were improved. In Comparative Example 2-1, an electron accepting material (Compound 4-15 or 4-16) was not doped in the anode-side hole transport layer. Therefore, it is believed that the electron accepting material is preferably doped in the anode-side hole transport layer.

In addition, when comparing Example 2-1 with Comparative Example 2-2, the properties of Example 2-1 were better. In addition, when comparing Example 2-5 with Comparative Example 2-4, the properties of Example 2-5 were better. In Comparative Example 2-2, the compounds included in the middle hole transport material layer and the emission layer-side hole transport layer were switched with respect to the compounds used in these layers in Example 2-1. In Comparative Example 2-4, the compounds included in the middle hole transport material layer and the emission layer-side hole transport layer were switched with respect to the compounds used in these layers in Example 2-5. Therefore, it is believed that the emission layer-side hole transport layer including the compound represented by Formula 1 is preferably positioned adjacent to the emission layer.

In addition, when comparing Examples 2-1 to 2-8 with Comparative Examples 2-3 and 2-5, the properties of Examples 2-1 to 2-8 were better. In Comparative Examples 2-3 and 2-5, hole transport material represented by Formula 2 (Compound 2-1) was included in the emission layer-side hole transport layer instead of the compound represented by Formula 1. Therefore, it is believed that it is preferable to include the compound represented by Formula 1 in the emission layer-side hole transport layer.

As described above, according to example embodiments, when the anode-side hole transport layer including anode-side hole transport material doped with the electron accepting material, the middle hole transport material layer, and the emission layer-side hole transport layer including the compound represented by Formula 1 are laminated between the first electrode (anode) and the emission layer, the emission life of the organic EL device may be increased.

Without being bound by any particular theory, it is believed that by including the emission layer-side hole transport layer including the compound represented by Formula 1 into the hole transport layer of the organic EL device, the emission layer-side hole transport layer may protect the hole transport layer from electrons not consumed in the emission layer and may prevent or reduce the diffusion of excited state energy (e.g., excitons) generated in the emission layer into the hole transport layer, thereby controlling the charge balance of the organic EL device. In addition, it is believed that by including the emission layer-side hole transport layer including the compound represented by Formula 1, the emission layer-side hole transport layer may restrain or reduce the diffusion of the electron accepting material included in the anode-side hole transport layer provided around (e.g., near) the first electrode (anode) into the emission layer.

As described above, when an anode-side hole transport layer, a middle hole transport material layer, and an emission layer-side hole transport layer according to embodiments of the present disclosure are provided between an anode and an emission layer of an organic EL device, the emission efficiency and emission life of the organic EL device may be improved.

As used herein, expressions such as "at least one of," "one of," "at least one selected from," and "one selected from," when preceding a list of elements, modify the entire list of elements and do not modify the individual elements of the list. Further, the use of "may" when describing embodiments of the present invention refers to "one or more embodiments of the present invention."

In addition, as used herein, the terms "use," "using," and "used" may be considered synonymous with the terms "utilize," "utilizing," and "utilized," respectively.

As used herein, the terms "substantially," "about," and similar terms are used as terms of approximation and not as terms of degree, and are intended to account for the inherent deviations in measured or calculated values that would be recognized by those of ordinary skill in the art.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

The above-disclosed subject matter is to be considered illustrative and not restrictive, and the appended claims and equivalents thereof are intended to cover all such modifications, enhancements, and other embodiments, which fall within the true spirit and scope of the present inventive concept. Thus, to the maximum extent allowed by law, the scope of the present inventive concept is to be determined by the broadest permissible interpretation of the following claims and their equivalents, and shall not be restricted or limited by the foregoing detailed description.

What is claimed is:

1. An organic electroluminescent (EL) device comprising:

an anode;

an emission layer;

an anode-side hole transport layer between the anode and the emission layer, the anode-side hole transport layer comprising an anode-side hole transport material doped with an electron accepting material;

a middle hole transport material layer between the anode-side hole transport layer and the emission layer, the middle hole transport material layer comprising a middle hole transport material being at least one selected from Compounds 2-2 to 2-8 and 2-10 to 2-16; and an emission layer-side hole transport layer between the middle hole transport material layer and the emission layer, the emission layer-side hole transport layer being adjacent to the emission layer and comprising an emission layer-side hole transport material represented by the following Formula 1:

Formula 1

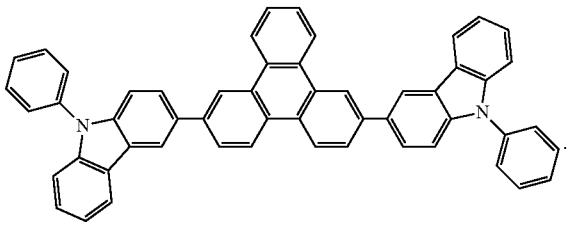

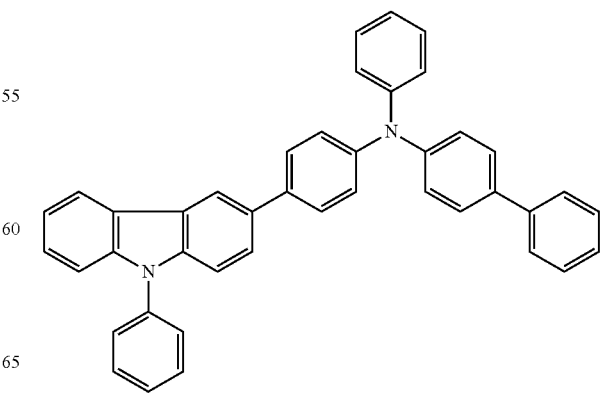

(2-2)

(2-3)
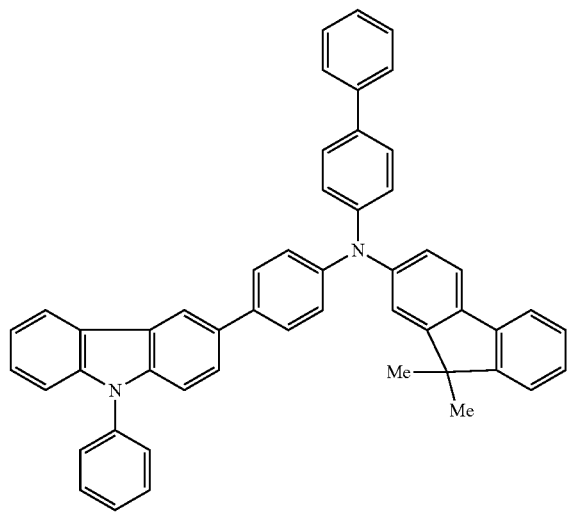
(2-2)
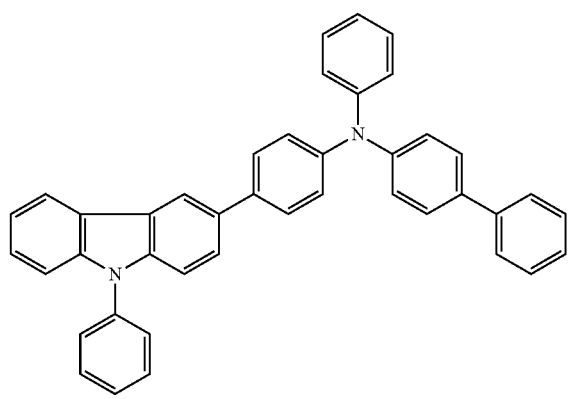
(2-4)
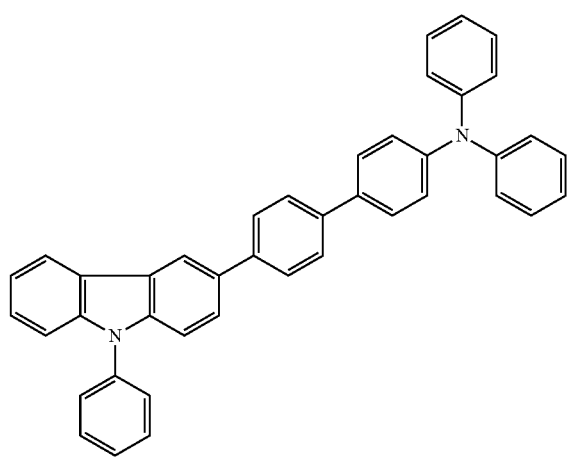
(2-5)
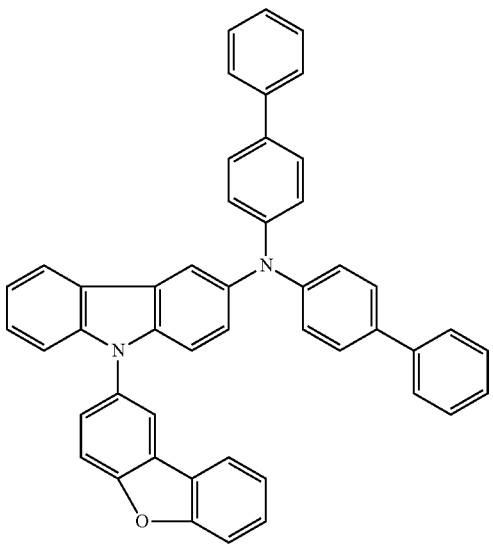
(2-6)
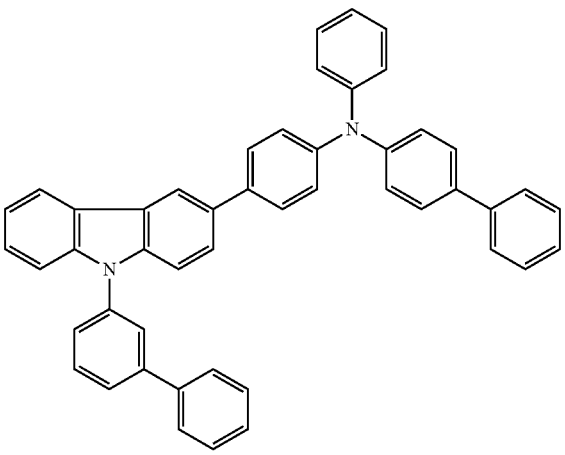
(2-7)
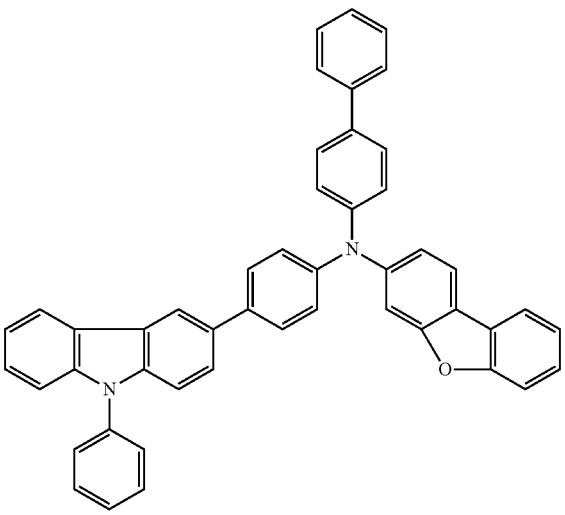

(2-8)
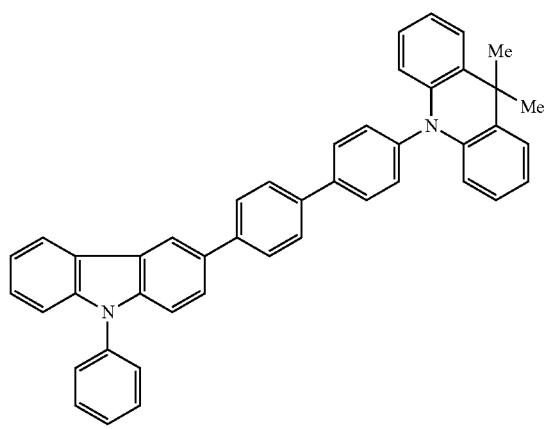
(2-10)
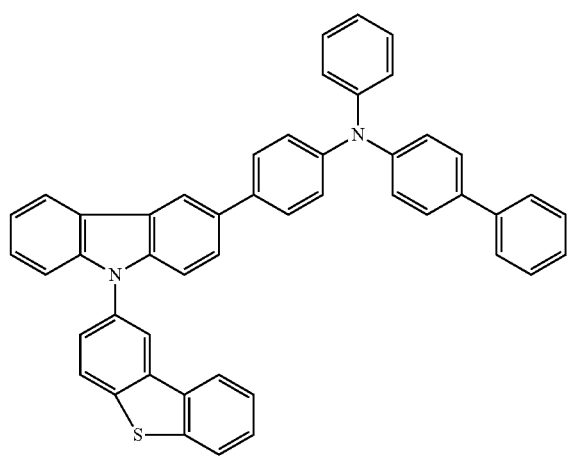
(2-11)
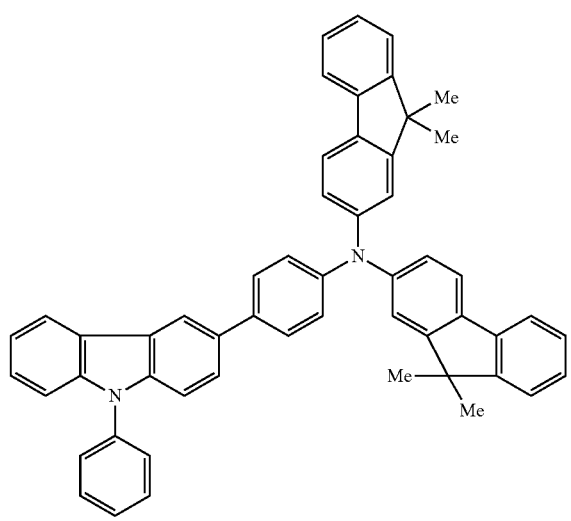
(2-12)
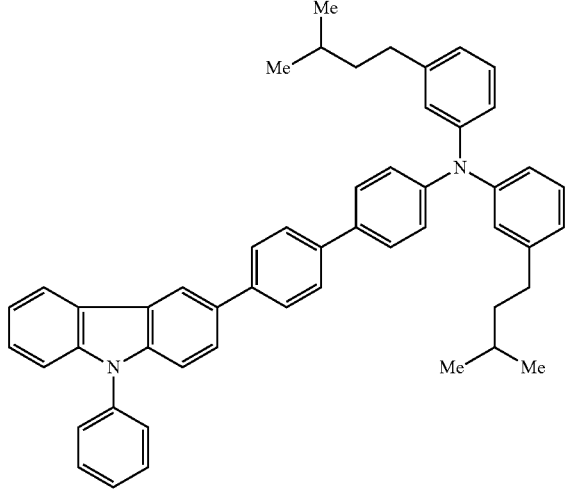
(2-13)
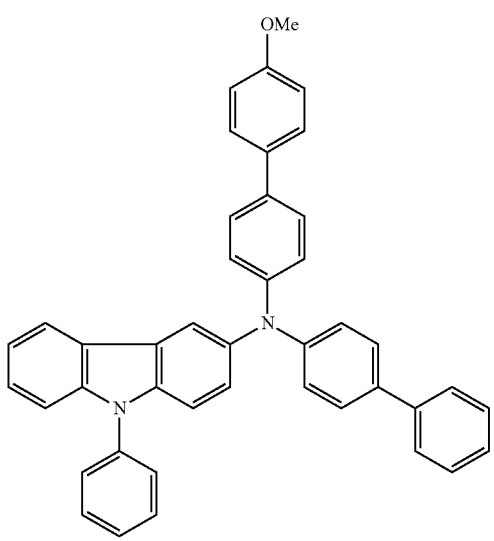
(2-14)
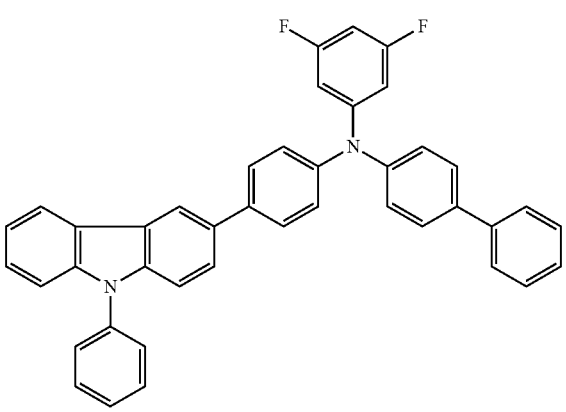

-continued (2-15)

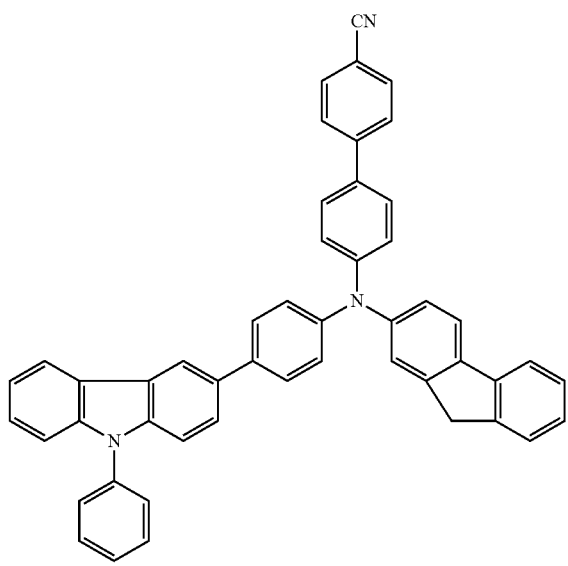

(2-16)

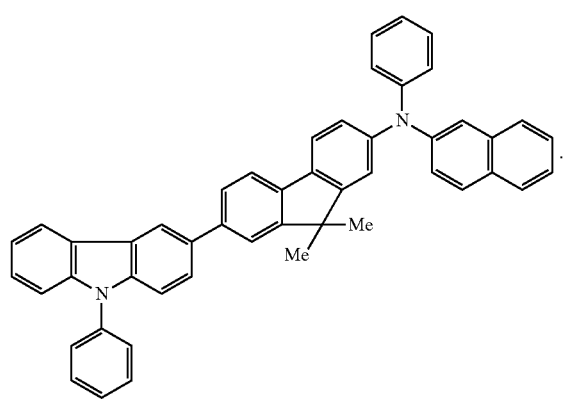

2. The organic EL device of claim 1, wherein the electron accepting material has a lowest unoccupied molecular orbital (LUMO) level from about −9.0 eV to about −4.0 eV.

3. The organic EL device of claim 1, wherein the anode-side hole transport layer is adjacent to the anode.

4. The organic EL device of claim 1, wherein the anode-side hole transport material is a compound represented by Formula 2:

Formula 2

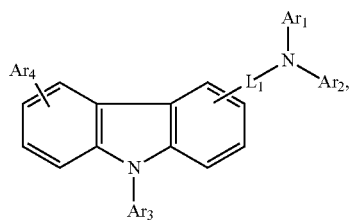

wherein, in Formula 2, $Ar_1$-$Ar_3$ are each independently a substituted or unsubstituted aryl group having 6 to 50 carbon atoms for forming a ring, or a substituted or unsubstituted heteroaryl group having 5 to 50 carbon atoms for forming a ring, $Ar_4$ is selected from hydrogen, deuterium, a halogen atom, a substituted or unsubstituted aryl group having 6 to 50 carbon atoms for forming a ring, a substituted or unsubstituted heteroaryl group having 5 to 50 carbon atoms for forming a ring, and a substituted or unsubstituted alkyl group having 1 to 50 carbon atoms, and $L_1$ is selected from a direct linkage, a substituted or unsubstituted arylene group having 6 to 18 carbon atoms for forming a ring, and a substituted or unsubstituted heteroarylene group having 5 to 15 carbon atoms for forming a ring.

5. The organic EL device of claim 1, wherein the emission layer comprises a luminescent material capable of emitting light via a singlet excited state.

6. The organic EL device of claim 1, wherein the emission layer comprises a compound represented by the following Formula 3:

Formula 3

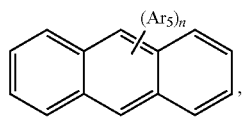

wherein, in Formula 3, $Ar_5$ is selected from hydrogen, deuterium, a substituted or unsubstituted alkyl group having 1 to 50 carbon atoms, a substituted or unsubstituted cycloalkyl group having 3 to 50 carbon atoms for forming a ring, a substituted or unsubstituted alkoxy group having 1 to 50 carbon atoms, a substituted or unsubstituted aralkyl group having 7 to 50 carbon atoms, a substituted or unsubstituted aryloxy group having 6 to 50 carbon atoms for forming a ring, a substituted or unsubstituted arylthio group having 6 to 50 carbon atoms for forming a ring, a substituted or unsubstituted alkoxycarbonyl group having 2 to 50 carbon atoms, a substituted or unsubstituted aryl group having 6 to 50 carbon atoms for forming a ring, a substituted or unsubstituted heteroaryl group having 5 to 50 carbon atoms for forming a ring, a substituted or unsubstituted silyl group, a carboxyl group, a halogen atom, a cyano group, a nitro group, and a hydroxyl group, and n is an integer selected from 1 to 10.

7. The organic EL device of claim 6, wherein the emission layer comprises at least one compound selected from Compounds 3-1 to 3-12, collectively denoted as Formula 8:

Formula 8

(3-1)

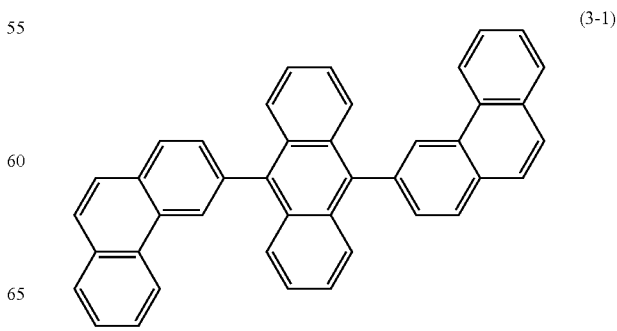

-continued
(3-2)
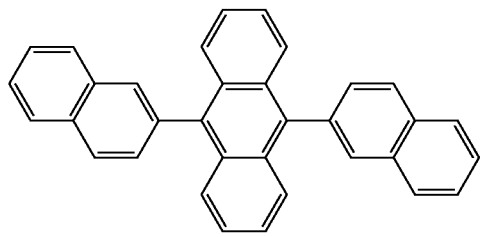
(3-3)
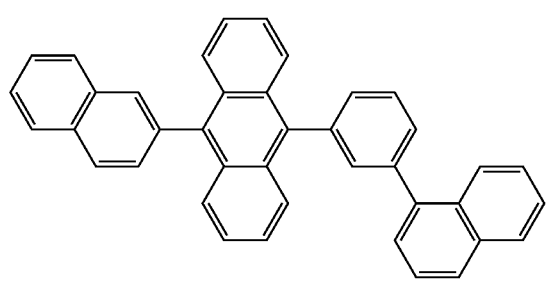
(3-4)
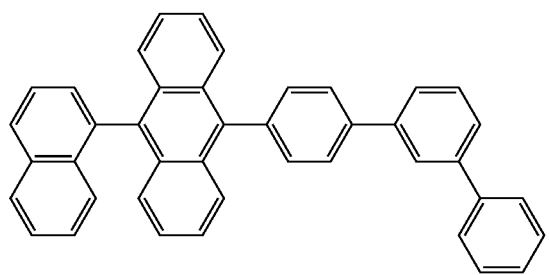
(3-5)
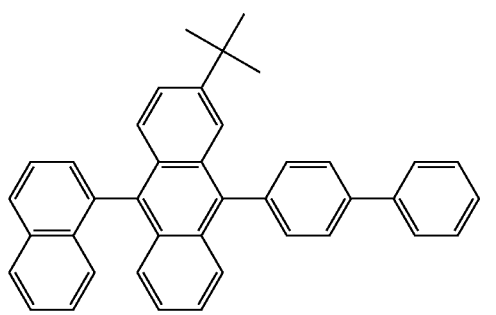
(3-6)
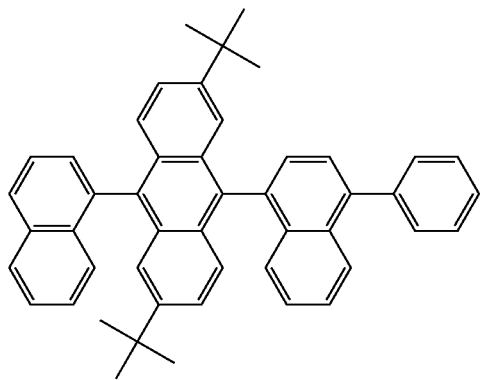
-continued
(3-7)
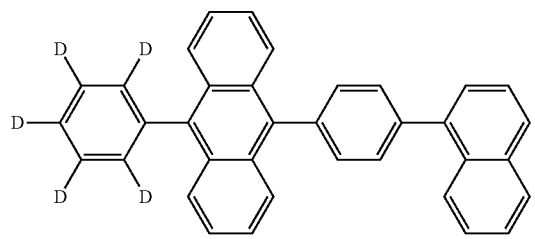
(3-8)
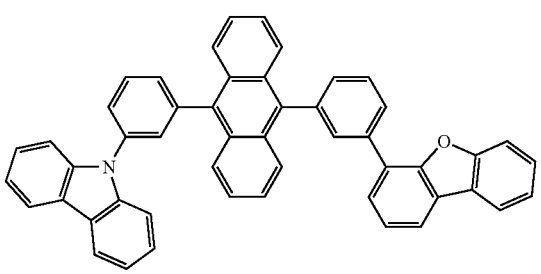
(3-9)
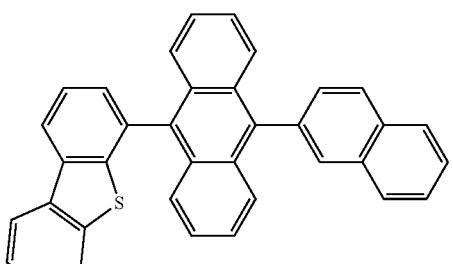
(3-10)
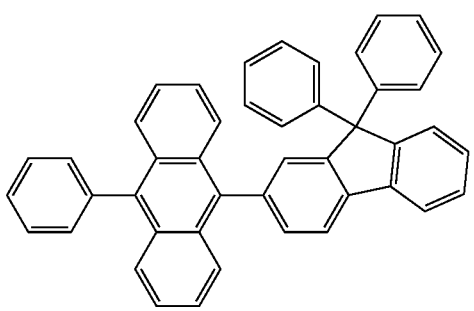
(3-11)
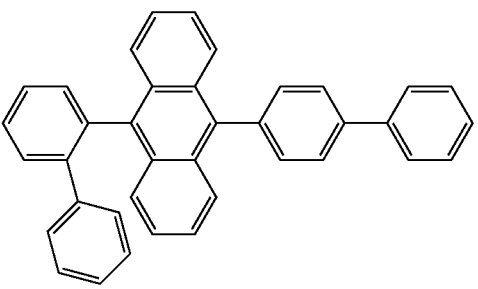

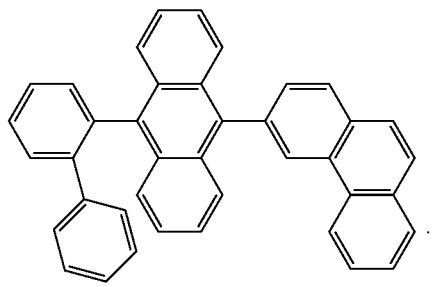
(3-12)
* * * * *